(12) United States Patent
Uchiyama

(10) Patent No.: US 8,450,853 B2
(45) Date of Patent: May 28, 2013

(54) SEMICONDUCTOR DEVICE AND A METHOD OF MANUFACTURING THE SAME, AND AN ELECTRONIC DEVICE

(75) Inventor: Kenta Uchiyama, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 500 days.

(21) Appl. No.: 12/706,861

(22) Filed: Feb. 17, 2010

(65) Prior Publication Data

US 2010/0213616 A1 Aug. 26, 2010

(30) Foreign Application Priority Data

Feb. 23, 2009 (JP) .................................. 2009-039213

(51) Int. Cl.
*H01L 23/48* (2006.01)
(52) U.S. Cl.
USPC ........... 257/773; 257/692; 257/700; 257/701; 257/720; 257/735
(58) Field of Classification Search
None
See application file for complete search history.

(56) References Cited

U.S. PATENT DOCUMENTS

| 5,222,014 | A | 6/1993 | Lin | |
|---|---|---|---|---|
| 2007/0287230 | A1* | 12/2007 | Kuramochi et al. | 438/128 |
| 2008/0246135 | A1* | 10/2008 | Wong et al. | 257/686 |

FOREIGN PATENT DOCUMENTS

| JP | 6-13541 A | 1/1994 |
|---|---|---|
| JP | 2004-342862 | 12/2004 |
| JP | 2007-287803 | 11/2007 |
| WO | WO02/15266 A2 | 2/2002 |
| WO | WO02/33751 A2 | 4/2002 |

OTHER PUBLICATIONS

Office Action dated Nov. 13, 2012 issued with respect to the basic Japanese Patent Application No. 2009-039213.

* cited by examiner

*Primary Examiner* — Kyoung Lee
(74) *Attorney, Agent, or Firm* — IPUSA, PLLC

(57) ABSTRACT

A semiconductor device includes an electronic component having an electrode pad provided on an electrode pad forming face, and a rear face positioned on a side opposite to the electrode pad forming face; an insulating member provided to seal a periphery of the electronic component, and having a first face exposing the electrode pad forming face of the electronic component and a second face exposing the rear face of the electronic component; a multi-layer wiring structure body provided to cover the first face of the insulating member, the electrode pad, and the electrode pad forming face, and including a plurality of insulating layers laminated on each other, and a wiring pattern; and a piercing electrode piercing the insulating member from the first face to the second face. The wiring pattern is directly connected to the electrode pad and the piercing electrode.

11 Claims, 23 Drawing Sheets

SEMICONDUCTOR DEVICE AND A METHOD OF MANUFACTURING THE SAME, AND AN ELECTRONIC DEVICE

CROSS-REFERENCE TO RELATED APPLICATIONS

This patent application is based upon and claims the benefit of priority of Japanese Patent Application No. 2009-039213 filed on Feb. 23, 2009 the entire contents of which are incorporated herein by reference.

BACKGROUND OF THE INVENTION

1. Field of the Invention

The present invention relates to a semiconductor device and a method of manufacturing the same, and an electronic device. More specifically, the present invention relates to a semiconductor device where a multi-layer wiring structure body and electronic components are electrically connected, a method of manufacturing the same, and an electronic device.

2. Description of the Related Art

FIG. 1 is a sectional view of a related-art electronic device.

Referring to FIG. 1, a related-art electronic device has semiconductor devices 201, 202, and an inside connection terminal 203. The semiconductor device 201 includes a wiring board 211, an electronic component 212, an under-fill resin 213, and an outside connection terminal 214.

The wiring board 211 is a plate-shaped multi-layer wiring structure body. The wiring board 211 includes laminated insulating layers 216, 217, wiring patterns 219, 228, 229, a pad 221, solder resist layers 222, 226, and outside connection pads 223, 224. The insulating layer 216 is provided on an upper surface 217A of the insulating layer 217.

The wiring pattern 219 and the pad 221 are provided on an upper surface 216A of the insulating layer 216. The wiring pattern 219 has pad portions 232, 233 exposed from the solder resist layer 222. The pad 221 is exposed from the solder resist layer 222.

The solder resist layer 222 is provided on the upper surface of the insulating layer 216A. The outside connection pads 223, 224 are provided on a lower surface of the insulating layer 217. Lower surfaces of the outside connection pads 223, 224 are exposed from the solder resist 226.

The solder resist layer 226 is provided on a lower surface 217B of the insulating layer 217. The wiring patterns 228, 229 are provided in the insulating layers 216, 217 laminated on each other. The wiring pattern 228 connects the pad portion 233 and the outside connection pad 223. The wiring pattern 229 connects the pad 221 and the outside connection pad 224.

The electronic component 212 is arranged between the semiconductor devices 201 and 202. The electronic component 212 has an electrode pad 236. The electrode pad 236 is electrically connected to the pad portion 232 via a bump 237 (for example, a solder bump).

The under-fill resin 213 is provided to fill a gap between the electronic component 212 and the wiring board 211. The outside connection terminal 214 is provided on lower surfaces of the outside connection pads 223, 224.

The semiconductor device 202 is arranged on an upper side of the semiconductor device 201. The semiconductor device 202 includes the wiring board 241, the electronic component 243, and a molding resin 246. The wiring board 241 is plate-shaped, and includes pads 251, 252, 254. The pad 251 faces the pad portion 233, and is electrically connected to the pad portion 233 via the inside connection terminal 203. The pad 252 faces the pad 221, and is electrically connected to the pad 221 via the inside connection terminal 203. The pad 254 is electrically connected to the pad 251 or 252.

The electronic component 243 is adhered on the wiring board 241, and is electrically connected to the pad 254 via a metal wire 244. The molding resin 246 is provided on the wiring board 241. The molding resin is provided to seal the metal wire 244 and the electronic component 243.

The inside connection terminal 203 has such a size (height) that the electronic component 212 and the semiconductor device 202 do not contact each other. The inside connection terminal 203 may have a height of 200 μm (see Japanese Laid-Open Patent Application Publication No. H6-13541, for example)

However, since the related-art semiconductor device 201 is such that the electronic component 212 arranged on the wiring board 211 and the wiring board 211 (multi-layer wiring structure body) are electrically connected, the related-art semiconductor device 201 has a problem that a size in a direction of height of the semiconductor device 201 is increased.

Furthermore, when the electronic component 212 and the wiring board 211 are electrically connected via the bump 237, it is necessary to arrange the bump 237 in order not to contact an adjacent bump 237. Therefore, there is a problem that it is difficult to reduce an arrangement pitch of the bumps 237, and that it is impossible to finely and densely arrange the wiring pattern 219 connected the bump 237.

Also, in the related-art electronic device 200, it is required that a height of the inside connection terminal 203 be greater than a sum of heights of the electronic component 212 and the bump 237. Accordingly, there is a problem that a size in a width of the electronic device 200 is increased.

Incidentally, when the electronic component 212 and the wiring board 211 are connected by wire-bonding, there is also a problem that widths of the electronic device 200 and the semiconductor device 201 are increased.

In view of such problems, an objective of the present invention is to provide a semiconductor device wherein a wiring pattern connected to an electrode pad of an electronic component is finely and densely arranged, and a size in a direction of a thickness is reduced, to provide a method of manufacturing the same, and to provide an electronic device.

SUMMARY OF THE INVENTION

Accordingly, embodiments of the present invention may provide a novel and useful semiconductor device, a method of manufacturing the same, and an electronic device solving one or more of the problems discussed above.

More specifically, the embodiments of the present invention may provide a semiconductor device, including an electronic component having an electrode pad provided on an electrode pad forming face, and a rear face positioned on a side opposite to the electrode pad forming face; an insulating member provided to seal a periphery of the electronic component, and having a first face exposing the electrode pad forming face of the electronic component and a second face exposing the rear face of the electronic component; a multi-layer wiring structure body provided to cover the first face of the insulating member, the electrode pad, and the electrode pad forming face, and including a plurality of insulating layers laminated on each other, and a wiring pattern; and a piercing electrode piercing the insulating member from the first face to the second face, wherein the wiring pattern is directly connected to the electrode pad and the piercing electrode.

Another aspect of the embodiment of the present invention may be to provide a semiconductor device, including an electronic component having an electrode pad provided on an electrode pad forming face, and a rear face positioned on a side opposite to the electrode pad forming face; an insulating member having a hollow portion housing the electronic component, a first face exposing the electrode pad forming face of the electronic component, and a second face exposing the rear face of the electronic component, said hollow portion penetrating the insulating member from the first face to the second face; a sealing resin provided in the hollow portion to seal a periphery of the electronic component, and having a first face of the sealing resin exposing the electrode pad forming face of the electronic component, and a second face of the sealing resin exposing the rear face of the electronic component; a multi-layer wiring structure body provided to cover the first face of the insulating member, the first face of the sealing member, the electrode pad, and the electrode pad forming face, and including a plurality of insulating layers laminated on each other, and a wiring pattern; and a piercing electrode piercing the insulating member from the first face to the second face, wherein the wiring pattern is directly connected to the electrode pad and the piercing electrode.

Another aspect of the embodiment of the present invention may be to provide a method of manufacturing a semiconductor device, including the steps of: mounting an electronic component having an electrode pad on an electrode pad forming face to a first face of a supporting body so that the first face of the supporting body contacts the electrode pad; forming an insulating member on the first face of the supporting body to seal a periphery of the electronic component; grinding the electronic component and the insulating member from a side opposite to the electrode pad forming face so that the electronic component and the insulating member are thinned; forming a through hole penetrating the insulating member; forming a piercing electrode in the through hole; removing the supporting body after forming the piercing electrode; and forming a multi-layer wiring structure body after removing the supporting body to cover the electrode pad, the electrode pad forming face, end faces of the insulating member and the piercing electrode located on a side of the electrode pad forming face, said multi-layer wiring structure body including a plurality of insulating layers laminated on each other and a wiring pattern, said wiring pattern directly connecting the electrode pad and the piercing electrode.

Another aspect of the embodiment of the present invention may be to provide a method of manufacturing a semiconductor device, including the steps of: forming an insulating member on a first face of a supporting body, said insulating member having a hollow portion exposing the first face and a through hole provided around the hollow portion; forming a piercing electrode in the through hole; mounting an electronic component having an electrode pad on an electrode pad forming face thereof to the first face of the supporting body exposed from the hollow portion; forming a sealing resin in the hollow portion to seal the electronic component; grinding the electronic component, the insulating member, the sealing resin, and the piercing electrode from a side of a rear face of the electronic component opposite to the electrode pad forming face, thereby thinning the electronic component; removing the supporting body after forming the piercing electrode and the sealing resin; and forming a multi-layer wiring structure body after removing the supporting body to cover the electrode pad, the electrode pad forming face, end faces of the insulating member, the sealing member, and the piercing electrode located on a side of the electrode pad forming face, said multi-layer wiring structure body including a plurality of insulating layers laminated on each other and a wiring pattern, said wiring pattern directly connecting the electrode pad and the piercing electrode.

Additional objects and advantages of the embodiments will be set forth in part in the description which follows, and in part will be obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory only and are not restrictive of the invention as claimed.

DETAILED DESCRIPTION OF THE PREFERRED EMBODIMENTS

A description is given below, with reference to FIG. 2 through FIG. 23 of embodiments of the present invention.

Preferred embodiments of the present invention are explained with reference to the drawings, as follows.
(First Embodiment)

Figure 1:
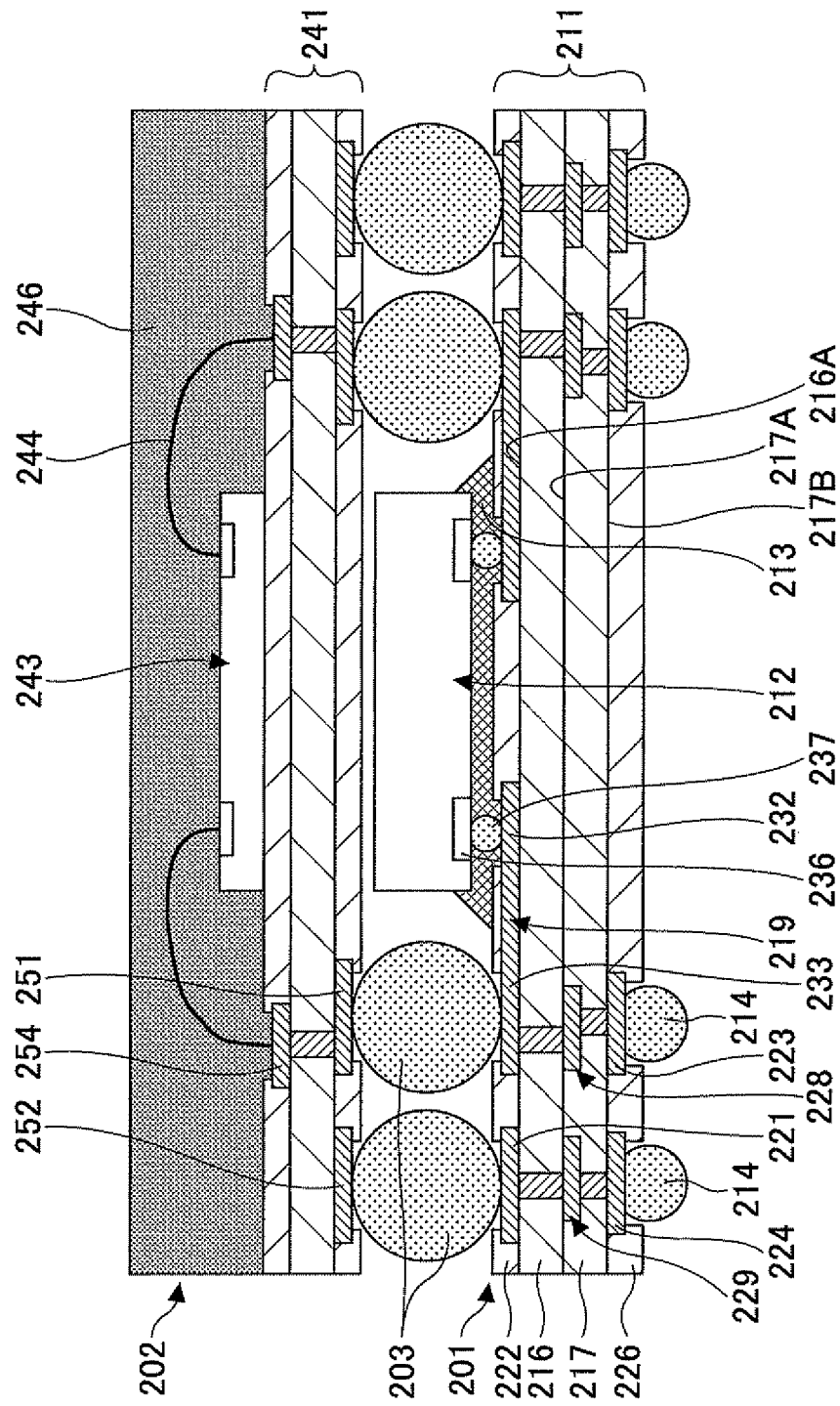
FIG. 1 is a sectional view of a related-art electronic device.
Figure 2:
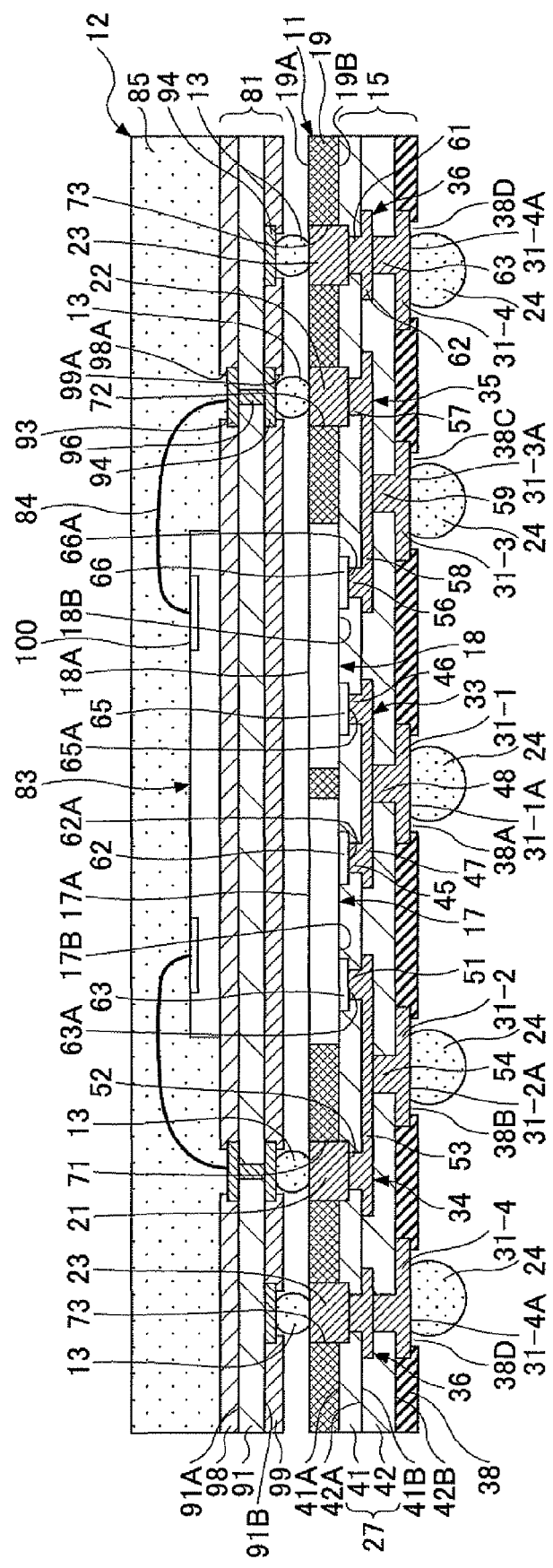
FIG. 2 is a sectional view of an electronic device according to a first embodiment of the present invention.
Figure 3:
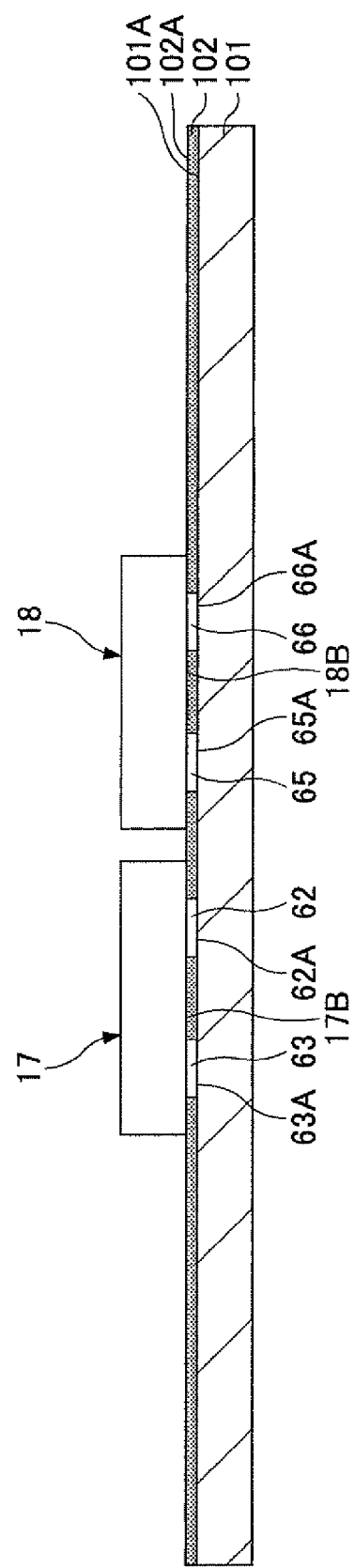
FIG. 3 is a drawing for showing a first phase of manufacturing the semiconductor device according to the first embodiment of the present invention.

FIG. 2 is a sectional view of an electronic device according to a first embodiment of the present invention.

Referring to FIG. 2, an electronic device 10 according to the first embodiment includes semiconductor devices 11, 12, and an inside connection terminal 13.

The semiconductor device 11 includes a multi-layer wiring structure body 15, electronic components 17, 18, an insulating member 19, piercing electrodes 21-23, and an outside connection terminal 24.

The multi-layer wiring structure body 15 is provided to cover a lower surface 19B (a first surface) of the insulating member 19, electrode pad forming surfaces 17B, 18B of the electronic components 17, 18, and electrode pads 62, 63, 65, 66 provided on thinned electronic components 17, 18.

The multi-layer wiring structure body 15 includes a laminated body 27, outside connection pads 31-1, 31-2, 31-3, 31-4, wiring patterns 33-36, and a solder resist layer 38.

The laminated body 27 is formed of a plurality of insulating layers 41, 42 laminated on top of each other. The insulating layer 41 is provided on lower faces of electrode pads 62, 63, 65, 66 provided on the electronic components 17, 18, an electrode pad forming face 17B of the electronic component 17 (a face where electrode pads 62, 63 are provided), an electrode pad forming face 18B of an electronic component 18 (a face where the electrode pads 65, 66 are provided), and a lower face 19B of an insulating member 19. As the insulating layer 41, an insulating resin layer (for example, epoxy-resin layer) may be employed. A thickness of the insulating layer 41 may be in a range of 5-30 μm.

The insulating layer 42 is provided onto a lower face 41B of the insulating layer 41. As the insulating layer 42, an insulating resin layer (for example, epoxy-resin layer) may be employed. A thickness of the insulating layer 42 may be in a range of 5-30 μm.

Outside connection pads 31-1, 31-2, 31-3, 31-4 are provided on a lower face 42 of the insulating layer 42B. The outside connection pad 31-1 is provided with a connecting face 31-1A to connect to the outside connection terminal 24. The outside connection pad 31-1 is connected to a wiring pattern 33. The outside connection pad 31-1 is electrically connected to the electronic components 17, 18 via the wiring pattern 33.

The outside connection pad 31-2 includes a connecting face 31-2A for the outside connection terminal 24 to be attached. The outside connection pad 31-2 is connected to a wiring pattern 34. The outside connection pad 31-2 is electrically connected to the semiconductor device 12 and the electronic component 17 via the wiring pattern 34.

The outside connection pad 31-3 includes a connecting face 31-3A for the outside connection terminal 24 to be attached. The outside connection pad 31-3 is connected to a wiring pattern 35. The outside connection pad 31-3 is electrically connected to the semiconductor device 12 and the electronic component 18 via the wiring pattern 35.

The outside connection pad 31-4 includes a connecting face 31-4A for the outside connection terminal 24 to be attached. The outside connection pad 31-4 is connected to a wiring pattern 36. The outside connection pad 31-4 is electrically connected to the semiconductor device 12 via the wiring pattern 36.

As materials for the outside connection pads 31-1, 31-2, 31-3, 31-4 described above, for example, copper (Cu) films may be employed.

The wiring patterns 33-36 are provided inside the laminated body 27 to pierce the laminated body 27. The wiring pattern 33 includes via-plugs 45, 46 as first connection components, and a wire 47. The via-plug 45 is provided to pierce a part of the insulating layer 41 facing the electrode pad 62 provided to the electronic component 17. In short, the via-plug 45 is exposed from a part of the insulating layer 41 corresponding to an attaching part of the electronic component 17. An upper end of the via-plug 45 is electrically directly connected to the electrode pad 62. Due to this configuration, the via-plug 45 is electrically connected to the electronic component 17.

The via-plug 46 is provided to pierce a part of the insulating layer 41 facing the electrode pad 65 provided to the electronic component 18. In short, the via-plug 46 is exposed from a part of the insulating layer 41 corresponding to an attaching part of the electronic component 18. An upper end of the via-plug 46 is electrically directly connected to the electrode pad 65. Due to this configuration, the via-plug 46 is electrically connected to the electronic component 18.

The wire 47 is provided on a lower face 41B of the insulating layer 41 and lower end faces of the via-plugs 45, 46. The wire 47 is connected to lower ends of the via-plugs 45, 46. The wire 47 is electrically connected to the electronic components 17, 18 through the via-plugs 45, 46.

The via-plug 48 is provided to pierce a part, located in between the wire 47 and the outside connection pad 31-1, of the insulating layer 42. An upper end of the via-plug 48 is connected to the wire 47. The via-plug 48 has a lower end connected to the outside connection pad 31-1. Due to this configuration, the via-plug 48 electrically connects the wire 47 and the outside connection pad 31-1. As a material for the wiring pattern 33 described above, a copper (Cu) film, for example, may be used.

The wiring pattern 34 includes a via-plug 51 as a first connection portion, a via-plug 52 as a second connection portion, a via-plug 54, and a wire 53. The via-plug 51 is provided to pierce a part, facing the electrode pad 63 of the electronic component 17, of the insulating later 41. Namely, the via-plug 51 is exposed from a part of the insulating layer 41 corresponding to an attaching region of the electronic component 17. The via-plug 51 has an upper end directly connected to the electrode pad 63. Due to this configuration, the via-plug 51 is electrically connected to the electronic component 17.

The via-plug 52 is provided to pierce a part, located under a piercing electrode 21, of the insulating layer 41. Namely, the via-plug 52 is exposed from a part of the insulating layer 41 located in an outside portion of an attaching region of the electronic component 17. The via-plug 52 has an upper end directly connected to a lower end of the piercing electrode 21. Due to this configuration, the via-plug 52 is electrically connected to the piercing electrode 21.

The wire 53 is provided on a lower face 41B of the insulating layer 41 and lower end faces of the via-plugs 51, 52. The wire 53 is connected to lower ends of the via-plugs 51, 52. Due to this configuration, the wire 53 is electrically connected to the electronic component 17 and the semiconductor device 12.

The via-plug 54 is provided to pierce a part of the insulating layer 42 located in between the wire 53 and the outside connection pad 31-2. The via-plug 54 has an upper end connected to the wire 53, and a lower end connected to the outside connection pad 31-2. Due to this configuration, the via-plug 54 electrically connects the wire 53 and the outside connection pad 31-2. As a material for the wiring pattern 34 described above, a copper (Cu) film, for example, may be used.

The wiring pattern 35 includes a via-plug 56 as a first connection portion, a via-plug 57 as a second connection portion, a wire 58, and a via-plug 59. The via-plug 56 is provided to pierce a part, facing the electrode pad 66 of the electronic component 18, of the insulating later 41. Namely, the via-plug 56 is exposed from a part of the insulating layer 41 corresponding to an attaching region of the electronic component 18. The via-plug 56 has an upper end directly connected to the electrode pad 66. Due to this configuration, the via-plug 56 is electrically connected to the electronic component 18.

The via-plug 57 is provided to pierce a part of the insulating layer 41 located under the piercing electrode 22. The via-plug 57 has an upper end directly connected to a lower end of the piercing electrode 22. Due to this configuration, the via-plug 57 is electrically connected to the piercing electrode 22.

The wire 58 is provided on a lower face 41B of the insulating layer 41 and lower end faces of the via-plugs 56, 57. The wire 58 is connected to lower ends of the via-plugs 56, 57. Due to this configuration, the wire 58 is electrically connected to the electronic component 18 and the semiconductor device 12 through the via-plugs 56, 57.

The via-plug 59 is provided to pierce a part of the insulating layer 42 located in between the wire 58 and the outside connection pad 31-3. The via-plug 59 has an upper end connected to the wire 58, and a lower end connected to the outside connection pad 31-3. Due to this configuration, the via-plug 59 electrically connects the wire 58 and the outside connection pad 31-3. As a material for the wiring pattern 35 described above, a copper (Cu) film, for example, may be used.

The wiring pattern 36 includes a via-plug 61 as a second connection portion, a via-plug 63, and a wire 62. The via-plug 61 is provided to pierce a part facing the piercing electrode 23 of the insulating later 41. Namely, the via-plug 61 is exposed from a part of the insulating layer 41 corresponding to an outside portion of an attaching region of the electronic component 18. The via-plug 61 has an upper end directly connected to a lower end of the piercing electrode 23. Due to this configuration, the via-plug 61 is electrically connected to the piercing electrode 23.

The wire 62 is provided on a lower face 41B of the insulating layer 41 and a lower end face of the via-plug 61. The wire 62 is connected to a lower end of the via-plug 61. Due to this configuration, the wire 62 is electrically connected to the piercing electrode 23 through the via-plug 61.

The via-plug 63 is provided to pierce a part of the insulating layer 42 located in between the wire 62 and the outside connection pad 31-4. The via-plug 63 has an upper end connected to the wire 62, and a lower end connected to the outside connection pad 31-4. Due to this configuration, the via-plug 63 electrically connects the wire 62 and the outside connection pad 31-4. As a material for the wiring pattern 36 described above, a copper (Cu) film, for example, may be used.

The solder resist layer 38 is provided on a lower face of the insulating layer 42. The solder resist layer 38 has an opening portion 38A exposing a connection face 31-1A, an opening portion 38B exposing a connection face 31-2A, an opening portion 38C exposing a connection face 31-3A, and an opening portion 38D exposing a connection face 31-4A.

The multi-layer wiring structure body 15 described above is shown in FIGS. 2, 13, and 14 to have a thickness greater than that of thinned electronic components 17, 18, or that of the insulating member 19. However, the multi-layer wiring structure body 15 actually has a thickness smaller than that of thinned electronic components 17, 18 (for example, 200-300 μm), or that of the insulating member 19 (for example, 200-300 μm). The multi-layer wiring structure body 15 may have, for example, a thickness of 20-80 μm. The multi-layer wiring structure body 15 is provided on the electrode pad forming faces 17B, 188 of the electronic components 17, 18, and a lower face 19B of the insulating member 19 to form a film shape or a layer shape.

The electronic component 17 is a thinned electronic component, and includes a rear face 17A, an electrode pad forming face 17B located on a side opposite to the rear face 17A, and a plurality of electrode pads 62, 63. The electronic component 17 is provided on an upper face 41A of the insulating layer 41 so that the electrode pad forming face 17B of the electronic component 17 and the upper face 41A (an upper face of the laminated body 27) of the insulating layer 41A contact each other. The electrode pads 62, 63 are provided on the electrode pad forming face 17B of the electronic component 17. The electrode pads 62, 63 protrude from the electrode pad forming face 17B of the electronic component 17. The electrode pads 62, 63 are covered by the insulating layer 41.

The electrode pad 62 has a connecting face 62A. The connecting face 62A is directly connected to an upper end of a via-plug 45, which is one of the elements constituting the wiring pattern 33. The electrode pad 63 includes a connection face 63A. The connection face 63A is directly connected to an upper end of a via-plug 51, which is one of elements constituting the wiring pattern 34. Namely, the electronic component 17 and the multi-layer wiring structure body 15 are electrically connected by directly connecting the electrode pads 62, 63, and the wiring patterns 33, 34. The electronic component 17 has a thickness of, for example, 200-300 μm at its portion arranged on the insulating layer 41.

The electronic component 18 is a thinned electronic component, and has a rear face 18A, an electrode pad forming face 18B located on a side opposite to the rear face 18A, and a plurality of electrode pads 65, 66. The electronic component 18 is provided on the insulating layer 41 so that the electrode pad forming face 18B of the electronic component 18 and the upper face 41A of the insulating layer 41A contact each other. The electrode pads 65, 66 are provided on the electrode pad forming face 18B of the electronic component 18. The electrode pads 65, 66 protrude from the electrode pad forming face 18B of the electronic component 18. The electrode pads 65, 66 are covered by the insulating layer 41.

The electrode pad 65 has a connection face 65A. The connection face 65A is directly connected to an upper end of a via-plug 46, which is one of the elements constituting the wiring pattern 33. The electrode pad 66 includes a connection face 66A. The connection face 66A is directly connected to an upper end of a via-plug 56, which is one of the elements constituting the wiring pattern 35. Namely, the electronic component 18 and the multi-layer wiring structure body 15 are electrically connected by directly connecting the electrode pads 65, 66, and the wiring patterns 33, 35.

The electronic component 18 has a thickness, at a portion positioned on an upper face 41A of the insulating layer 41, approximately the same as that of the electronic component 17 at a portion arranged on the upper face 41A of the insulating layer 41. The electronic component 18 may have a thickness of, at the portion arranged on the upper face 41A of the insulating layer 41, for example, 200-300 μm.

In a manner described above, the electronic components 17, 18 are provided on the upper face 41A of the insulating layer 41 so that the upper face 41A of the insulating layer 41 and the electrode pad forming faces 17B, 18B of the electronic components 17, 18 contact each other; the electrode pads 62, 63 provided to the electronic component 17 and the via-plugs 45, 51 forming the wiring patterns 33, 34 are directly connected; and the electrode pads 65, 66 provided to the electronic component 18 and the via-plugs 46, 56 forming the wiring patterns 33, 35 are directly connected. Therefore, a size in a thickness direction of a semiconductor device may be reduced, compared to the related-art semiconductor device where electronic components and wiring patterns are electrically connected through bumps or metal wires.

Furthermore, bumps (for example, solder bumps) for connecting the electronic components 17, 18 and the wiring patterns 33-35 become unnecessary by directly connecting the electrode pads 62, 63, 65, 66 and the wiring patterns 33-35. Therefore, the wiring patterns 33-35 (specifically, the via-plugs 45, 46, 51, 56 and the wire 47, 53, 58) may be finely and densely arranged.

Semiconductor chips may be employed as the electronic components 17, 18. Specifically, the semiconductor chips for a CPU (Central Processing Unit) may be employed as the electronic components 17, 18. The semiconductor chip for the CPU may be employed as one of the electronic components 17, 18, and the semiconductor chip for a memory may be employed as the other. Also, the semiconductor chip for the CPU may be employed for one of the electronic components 17, 18, and a semiconductor chip for a GPU (Graphics Processing Unit) may be employed for the other.

The insulating member 19 is provided on the upper face 41A of the insulating layer 41 to cover lateral faces of the electronic components 17, 18. Due to this configuration, the insulating member 19 seals peripheries (lateral portions) of the electronic components 17, 18. The insulating member 19 has a thickness substantially equal to that of parts of the electronic components 17, 18 located on the upper face 41A of the insulating layer 41. The thickness of the insulating member may be, for example, 200-300 μm.

The upper face 19A of the insulating member 19 is formed to share substantially one plane with the rear faces 17B, 18B of the electronic components 17, 18. Due to this configuration, the upper face 19A of the insulating member 19 and the rear faces 17A, 18B of the electronic components 17, 18 are arranged in the same plane.

Therefore, the insulating member 19 is provided on the upper face 41A of the insulating layer 41 to seal the lateral faces of the electronic components 17, 18, and to have the upper face 19A forming substantially one plane with the rear faces 17A, 18A of the electronic components 17, 18. Due to this configuration, the electronic components 17, 18 may be sealed without increasing the semiconductor device 11 thickness.

The insulating member 19 has through holes 71-73. The through hole 71 is formed to expose an upper end of the via-plug 52. The through hole 72 is formed to expose an upper end of the via-plug 57. The through hole 73 is formed to expose an upper end of the via-plug 61.

As the insulating member 19 described above, a molding resin, for example, may be employed. As the molding resin, an epoxy resin, for example, may be employed.

The piercing electrode 21 is provided in the through hole 71. An upper end face of the piercing electrode 21 is flat, and arranged to share the same flat plane with the upper face 19A of the insulating member 19. The piercing electrode 21 has an upper end connected to the inside connection terminal 13. The piercing electrode 21 is electrically connected to the semiconductor device 12 through the inside connection terminal 13. The piercing electrode 21 has a lower end face which forms a flat plane and is arranged to share a substantially same plane with the lower face 19A of the insulating member 19. Incidentally, the piercing electrode 21 protrudes from the lower face 19B of the insulating member 19 by the thickness of an adhesive 102 at the time of manufacturing. Therefore, the lower end face of the piercing electrode 21 and the lower face 19B of the insulating member 19 are not actually on the exact same plane.

The lower end of the piercing electrode 21 is directly connected to the via-plug 52. Due to this configuration, the piercing electrode 21 is electrically connected to the outside connection pad 31-2 through the wiring pattern 34. As a material for the piercing electrode 21, a copper (Cu) film, for example, may be employed.

The piercing electrode 22 is provided in a through hole 72. An upper end face of the piercing electrode 22 is flat, and arranged to share the same flat plane with the upper face 19A of the insulating member 19. The piercing electrode 22 has an upper end connected to the inside connection terminal 13. The piercing electrode 22 is electrically connected to the semiconductor device 12 through the inside connection terminal 13. The piercing electrode 22 has a lower end face which forms a flat plane and is arranged to share a substantially same plane with the lower face 19B of the insulating member 19. Incidentally, the piercing electrode 22 protrudes from the lower face 19B of the insulating member 19 to the extent of the thickness of an adhesive 102 at the time of manufacturing. Therefore, the lower end face of the piercing electrode 22 and the lower face 19B of the insulating member 19 are not actually on the exact same plane.

The lower end of the piercing electrode 22 is directly connected to the via-plug 57. Due to this configuration, the piercing electrode 22 is electrically connected to the outside connection pad 31-3 through the wiring pattern 35. As a material for the piercing electrode 22, a copper (Cu) film, for example, may be employed.

The piercing electrode 23 is provided in a through hole 73. An upper end face of the piercing electrode 23 is flat, and arranged to share the same flat plane with the upper face 19A of the insulating member 19. The piercing electrode 23 has an upper end connected to the inside connection terminal 13. The piercing electrode 23 is electrically connected to the semiconductor device 12 through the inside connection terminal 13. The piercing electrode 23 has a lower end face which forms a flat plane and is arranged to share a substantially same plane with the lower face 19B of the insulating member 19. Incidentally, the piercing electrode 23 protrudes from the lower face 19B of the insulating member 19 to the extent of the thickness of an adhesive 102 at the time of manufacturing. Therefore, the lower end face of the piercing electrode 23 and the lower face 19B of the insulating member 19 are not actually on the exact same plane.

The lower end of the piercing electrode 23 is directly connected to the via-plug 61. Due to this configuration, the piercing electrode 23 is electrically connected to the outside connection pad 31-4 through the wiring pattern 36. As a material for the piercing electrode 23, a copper (Cu) film, for example, may be employed.

As explained above, the piercing electrodes 21-23 have upper end faces which are arranged in the same plane as the rear faces 17A, 18A of the electronic components 17, 18 and the upper face 19A of the insulating member 19.

As shown above, the inside connection terminal 13 and the piercing electrodes 21-23 connected thereto are provided to pierce the insulating member 19. Upper end faces of the piercing electrodes 21-23, the rear faces 17A, 18A of the electronic components 17, 18, and the upper face 19A of the insulating member 19 are arranged in the same plane. Due to this configuration, an upper face of the semiconductor device 11, which faces the semiconductor device 12, may be flat. Therefore, the size in a direction of the thickness of the inside connection terminal 13 for electrically connecting the semiconductor devices 11 and 12 may be reduced. As such, the thickness of the electronic device 10 is reduced.

Furthermore, by reducing the size in a direction of the height of the inside connection terminal 13, the piercing electrodes 21-23 may be arranged with short pitches. Due to this configuration, the number of portions for electrical connections between the semiconductor devices 11, and 12 may be increased (in other words, the number of the inside connection terminals 13 arranged between the semiconductor devices 11, and 12 may be increased).

Also, since the inside connection terminal 13 such as a solder ball is downsized, the pitch between the piercing electrodes 21-23 may be reduced. Incidentally, a protective layer (for example, Ni/Au laminated layers which are formed by laminating Ni coat layers and Au coat layers alternately on the end faces of the piercing electrodes 21-23) may be provided on end faces of the piercing electrodes 21-23 on a side of connection with the inside connection terminal 13.

The outside connection terminal 24 is provided on each of connection faces 31-1A, 31-2A, 31-3A, and 31-4A. The outside connection terminal 24 is a terminal to connect a pad provided on a mounting substrate at the time of connection of the electronic device 10 and the mounting substrate such as a mother board. As the outside connection terminal 24, a solder ball may be employed, for example. In FIG. 2, the solder ball is exemplified as the outside connection terminal 24. Nevertheless, a terminal pin may be used as the outside connection terminal 24 instead of the solder ball.

In a semiconductor device according to one embodiment of the present invention, the electronic components 17, 18 are provided on an upper face 41A of the insulating layer 41 so that an upper face 41A of the insulating layer 41 contacts electrode pad forming faces 17B, 18B of the electronic components 17, 18. The electrode pads 62, 63 provided to the electronic component 17 are directly connected to the via-plugs 45, 51 forming the wiring patterns 33, 34. The electrode pads 65, 66 provided to the electronic component 18 are directly connected to the via-plugs 46, 56 forming the wiring pattern 33, 35. Due to this configuration, the thickness of the semiconductor device 11 may be reduced as compared to the related-art semiconductor device where the electronic components and the wiring patterns are electrically connected through the bump or the metal wire.

Also, by directly connecting the electrode pads 62, 63, 65, 66 provided to the electronic components 17, 18 and the wiring patterns 33-35, there is no need for a bump (for example, solder bump) connecting the electronic components 17, 18 and the wiring patterns 33-35. Therefore, it is possible to finely and densely arrange the wiring patterns 33-35 (specifically, the via-plugs 45, 46, 51, 56 and the wires 47, 53, 58).

The semiconductor device 12 is provided on an upper side of the semiconductor device 11, and has a wiring board 81, an electronic component 83, and a molding resin 85. The wiring board 81 includes a substrate 91, pads 93, 94, a wiring pattern 96, and solder resist layers 98, 99. The substrate 91 is in a plate shape. As the substrate 91, for example, a laminated body which is formed of a plurality of laminated insulating resin layers may be used.

The pad 93 is provided on an upper face 91A of the substrate 91. The pad 93 is connected to one of ends of the metal wire 84 (for example, Au wire) and an upper end of the wiring pattern 96. The pad 93 is electrically connected to the electronic component 83 through a metal wire 84. As a material for the pad 93, a copper (Cu) film, for example, may be used.

The pad 94 is provided on a lower face 91B of the substrate 91. The pad 94 is connected to a lower end of the wiring pattern 96 and the inside connection terminal 13. The pad 94 is electrically connected to the pad 93 through the wiring pattern 96, and also electrically connected to the semiconductor device 11 through the inside connection terminal 13. As a material for the pad 94, a copper (Cu) film, for example, may be used.

The wiring pattern 96 is arranged inside of the substrate 91 to pierce the substrate 91. The wiring pattern 96 is, for example, constituted by a plurality of wires and via-plugs (not shown). The wiring pattern 96 has an upper end connected to the pad 93 and a lower end connected to the pad 94.

A solder resist layer 98 is provided on an upper face 91A of the substrate 91. The solder resist layer 98 includes an opening portion 98A exposing an upper face of the pad 93.

A solder resist layer 99 is provided on a lower face 91B of the substrate 91. The solder resist layer 99 includes an opening portion 99A exposing a lower face of the pad 94.

The electronic component 83 includes a plurality of electrode pads 100. The electronic component 83 is adhered to the solder resist layer 98 so that a face of the electronic component 83 where the electrode pad 100 is not provided contacts an upper face of the solder resist layer 98. The electrode pad 100 is connected to the other end of the metal wire 84. Due to this configuration, the electronic component 83 is electrically connected to the wiring board 81 through the metal wire 84. As the electronic component 83, a semiconductor chip for a memory, for example, may be used.

The molding resin 85 is provided on an upper face of the pad 93 and an upper face of the solder resist layer 98 to cover the electronic component 83 and the metal wire 84. As a material for the molding resin 85, an epoxy resin, for example, may be used.

The inside connection terminal 13 is arranged between the semiconductor devices 11, and 12, and connected to one of upper ends of the piercing electrodes 21-23 and the pad 94. Due to this configuration, the inside connection terminal 13 electrically connects the semiconductor devices 11, and 12. As explained above, the upper face of the semiconductor device 11 facing the semiconductor device 12 is flat. Therefore, it is possible to reduce the height of the inside connection terminal 13. For example, the height of the inside connection terminal 13 may be 30 μm. As the inside connection terminal 13, a solder ball may be used, for example.

In the electronic device according to one embodiment of the present invention, the semiconductor device 11 having the rear faces 17A, 18A of the electronic components 17, 18, the upper face 19A of the insulating member 19, and the upper end faces of the piercing electrodes 21-23 provided on one plane, and also having a flat face facing the semiconductor device 12, and the semiconductor device 12 provided on a upper side of the semiconductor device 11 are electrically connected through the inside connection terminal 13. Due to this configuration, the thickness of the inside connection terminal 13 may be reduced. Accordingly, the height of the electronic device 10 may be also reduced.

In FIGS. 3-14, a process of manufacturing a semiconductor device according to the first embodiment of the invention is shown. In FIGS. 3-14, parts that are the same as the parts of the semiconductor device 11 are given the same reference numerals.

Referring to FIGS. 3-14, a method of manufacturing a semiconductor device 11 according to the first embodiment of the invention is explained. First, in a process shown in FIG. 3, an adhesive 102 is formed on an upper face 101A of a supporting body 101. Afterward, the electronic components 17, 18 are adhered to the supporting body 101 through the adhesive 102 (electronic component adhering process).

At this time, the electronic components 17, 18 are adhered to the supporting body 101 so that the upper face 101A of the supporting body 101 contacts connecting faces 62A, 63A, 65A, 66A of the electrode pads 62, 63, 65, 66. Incidentally, it is better to push the electronic components 17, 18 toward the adhesive 102 so that the electronic components 17, 18 are embedded in the adhesive 102 so that the connecting faces 62A, 63A, 65A, 66A of the electrode pads 62, 63, 65, 66 contact the upper face 101A of the supporting body 101.

In this phase, the electronic components 17, 18 are not thinned yet. Because the electronic components 17, 18 are not thinned, it is easier to handle these electronic components 17, 18 than thinned ones. Therefore, it is possible to accurately adhere the electronic components 17, 18 in a predetermined position of the supporting body 101. The thicknesses of the pre-thinned electronic components 17, 18 (that is, the thicknesses before thinning) may be, for example, 700 μm.

As the electronic components 17, 18, for example, a semiconductor chip may be used. Specifically, a semiconductor chip for a CPU (central processing unit) may be used. Also, the semiconductor chip for the CPU may be used as one of the electronic components 17, 18, and a semiconductor chip for a memory may be used as the other. Alternatively, the semiconductor chip for the CPU may be used as one of the electronic components 17, 18, and a semiconductor chip for a GPU (Graphics Processing Unit) may be used as the other.

As the supporting body 101, for example, a glass substrate, a silicon substrate, or a metal substrate (for example, copper (Cu) plate) may be used. The thickness of the supporting body 101 is, for example, 300-600 μm. The adhesive 102 may be, for example, a polyimide resin tape with adherence (for example, the thickness is 1-20 μm).

Figure 4:
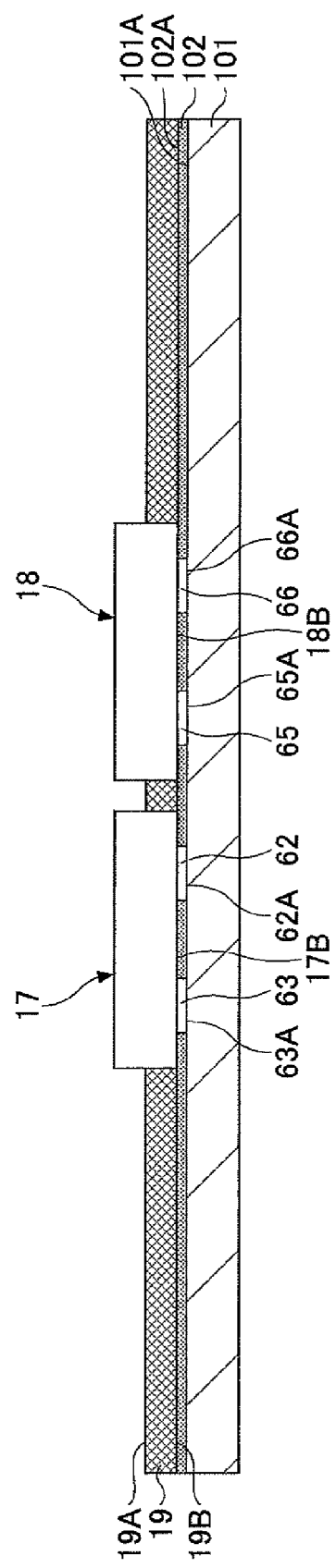
FIG. 4 is a drawing for showing a second phase of manufacturing the semiconductor device according to the first embodiment of the present invention.

Next, in a process shown in FIG. 4, an insulating member 19 is provided on the upper face 102A of the adhesive 102 to partially seal lateral faces of the electronic components 17, 18 (insulating member forming process). As the insulating member 19, a molding resin (for example, a molding resin formed of an epoxy resin) may be used, for example. The insulating member 19 may be, for example, formed by a transfer molding method. The insulating member 19 is provided so that an upper face of the insulating member 19 is located above rear faces 17A, 18A of the thinned electronic components 17, 18. In this phase, the height of the insulating member 19 may be, for example, 300 μm.

Figure 5:
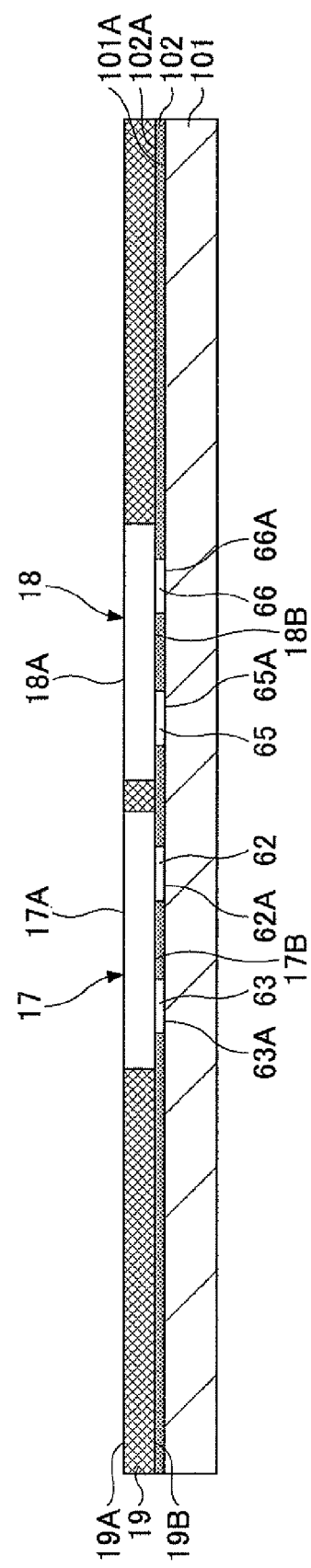
FIG. 5 is a drawing for showing a third phase of manufacturing the semiconductor device according to the first embodiment of the present invention.

In a process shown in FIG. 5, by grinding (for example, by means of a backside grinder) the electronic components 17, 18 and the insulating member 19 from an upper face side of a structure body shown in FIG. 4 (from a side of the rear faces 17A, 18A of the electronic components 17, 18), the electronic components 17, 18 are thinned (grinding process). The rear faces 17A, 18A of the thinned electronic components 17, 18 are arranged in a plane same as the upper face 19A of the insulating member 19.

Due to the grinding process, the structure body shown in FIG. 5 has a flat face. The thicknesses of the thinned electronic components 17, 18 may be, for example, 200 μm (the thicknesses of parts of the electronic components 17, 18 located on the adhesive 102). In this example, the thickness of the insulating member 19 after the grinding process may be, for example, 200 μm.

Figure 6:
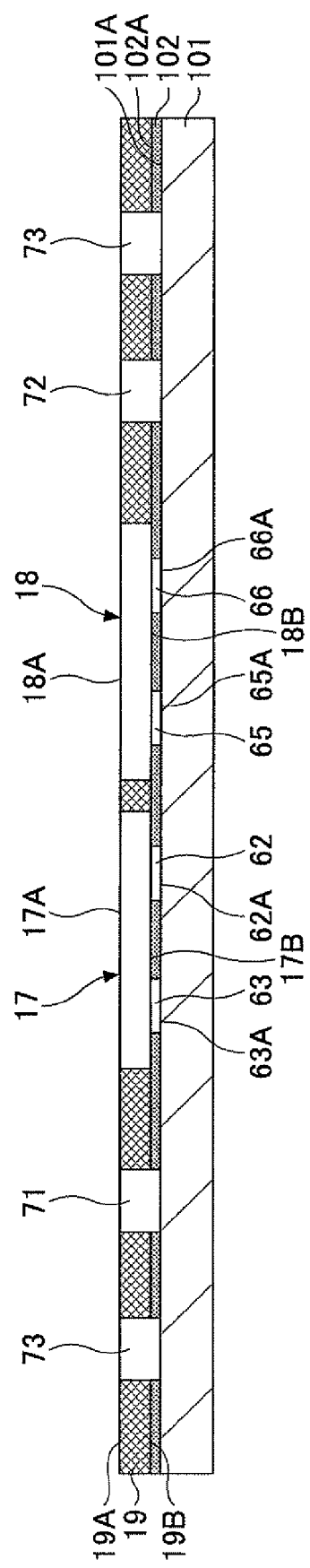
FIG. 6 is a drawing for showing a fourth phase of manufacturing the semiconductor device according to the first embodiment of the present invention.

In a process shown in FIG. 6, the through holes 71-73 are formed by piercing from the upper face 19A of the insulating member 19 to the insulating member 19 and the adhesive 102 (through hole forming process).

The through holes 71-73 are formed by, for example, laser irradiation to parts of the insulating member 19 and the adhesive 102 corresponding to through hole forming regions. The through holes 71-73 are configured to expose the upper face 101A of the supporting body 101. Diameters of the through holes are, for example, 200 μm.

Figure 7:
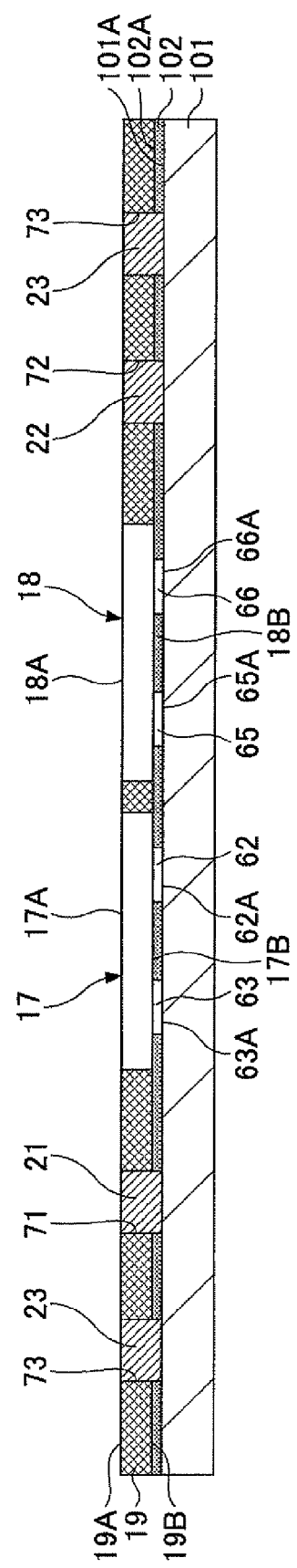
FIG. 7 is a drawing for showing a fifth phase of manufacturing the semiconductor device according to the first embodiment of the present invention.

Next, in a process shown in FIG. 7, the piercing electrode 21 filling up the through hole 71, the piercing electrode 22 filling up the through hole 72, and the piercing electrode 23 filling up the through hole 73 are simultaneously formed (piercing electrode forming process).

At this time, the piercing electrodes 21-23 are formed so that the upper end faces of the piercing electrodes 21-23, the rear faces 17A, 18A of the electronic components 17, 18, and the upper face 19A of the insulating member 19 are arranged in the same plane. The piercing electrode 21-23 may be formed by, for example, a plating method, a printing method or the like.

In a case of forming the piercing electrodes 21-23 by the plating method, a copper (Cu) film layer is formed by a sputtering method on the upper face 101A of the supporting body 101 (for example, a silicon substrate, a glass substrate or the like). Afterwards, processes that are the same as those explained above in FIGS. 3-6 are conducted, and the copper (Cu) film layer is charged. Subsequently, a plating film is formed to fill up the through holes 71-73 and form the piercing electrodes 21-23. A material for the piercing electrodes 21-23 may be, for example, a copper (Cu) film.

Incidentally, in a case of using a metal plate (for example, a copper (Cu) plate) as the supporting body, it is not necessary to form the copper (Cu) film layer because the supporting body 101 serves a function as a power feeding layer.

Furthermore, after forming the piercing electrodes 21-23, a protective layer (for example, Ni/Au laminated layers which are formed by laminating Ni coat layers and Au coat layers alternately on the end faces of the piercing electrodes 21-23) may be formed on end faces of the piercing electrodes 21-23 on a side where the inside connection terminals are connected.

Subsequently, in a process shown in FIG. 8, the adhesive 102 and the supporting body 101 are removed from the electronic components 17, 18 and the insulating member 19 having the piercing electrodes 21-23 therein (supporting body removing process).

To be specific, for example, by mechanically removing the supporting body 101 from the electronic components 17, 18 and the insulating member 19 having the piercing electrodes 21-23 formed therein shown in FIG. 7, the adhesive 102 is removed together with the supporting body 101. Due to this process, the piercing electrodes 21-23 and the electrode pads 62, 63, 65, 66 protrude from the lower face 19B of the insulating member 19 by the thickness of the adhesive. Nevertheless, such protrusions would not cause any problems in the manufacturing process. Also, the lower end faces of the piercing electrodes 21-23, connecting faces 62A, 63A, 65A, 66A of the electrode pads 62, 63, 65, 66, and the lower face 19B of the insulating member 19 are not positioned in an exact same plane.

Figure 9:
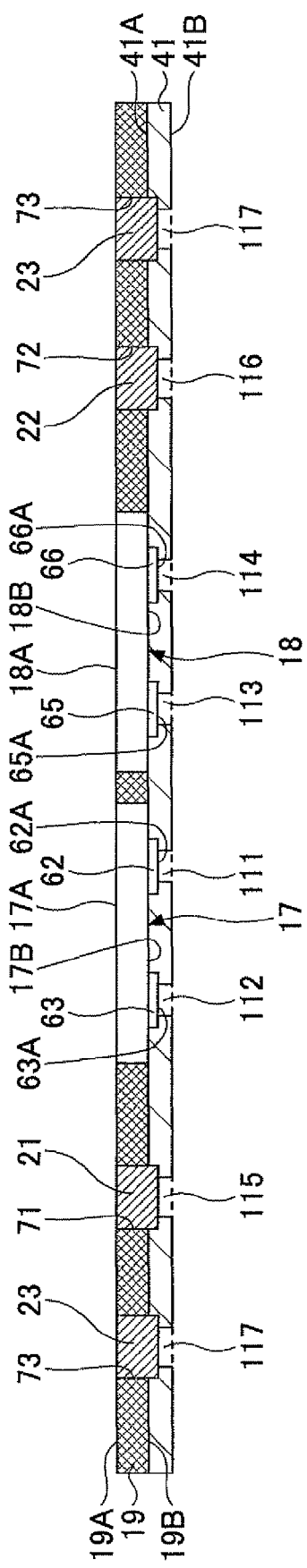
FIG. 9 is a drawing for showing a seventh phase of manufacturing the semiconductor device according to the first embodiment of the present invention.

Subsequently, in a process shown in FIG. 9, an insulating layer 41 is formed to have opening portions 111-117 provided on the lower face 19B of the insulating member 19, the electrode pads 62, 63, 65, 66, the electrode pad forming faces 17B, 18B of the electronic components 17, 18, and the lower end faces of the piercing electrodes 21-23.

Figure 8:
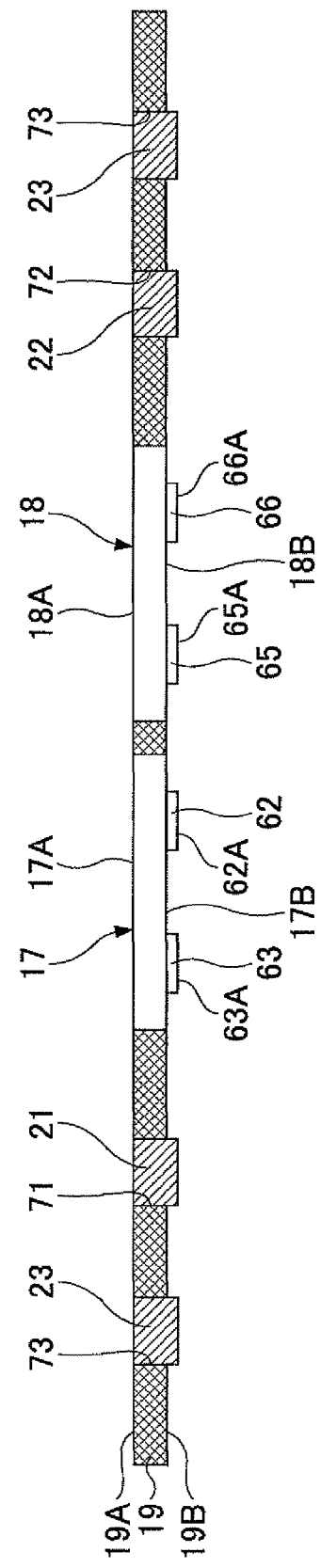
FIG. 8 is a drawing for showing a sixth phase of manufacturing the semiconductor device according to the first embodiment of the present invention.

Specifically, the insulating layer 41 is formed by conducting a laser irradiation process to portions of an insulating resin film corresponding to the opening portions 111-117 after attaching the insulating resin film (for example, an epoxy resin film) as a material of the insulating layer 41 to a lower face of a structure body shown in FIG. 8.

The opening portion 111 is formed to expose the connecting face 62A, and the opening portion 112 is formed to expose the connecting face 63A. Also, the opening portion 113 is formed to expose the connecting face 65A, and the opening portion 114 is formed to expose the connecting face 66A. The opening portion 115 is formed to expose a lower end face of the piercing electrode 21, and the opening portion 116 is formed to expose a lower end face of the piercing electrode 22. The opening portion 117 is formed to expose a lower end face of the piercing electrode 23.

Figure 10:
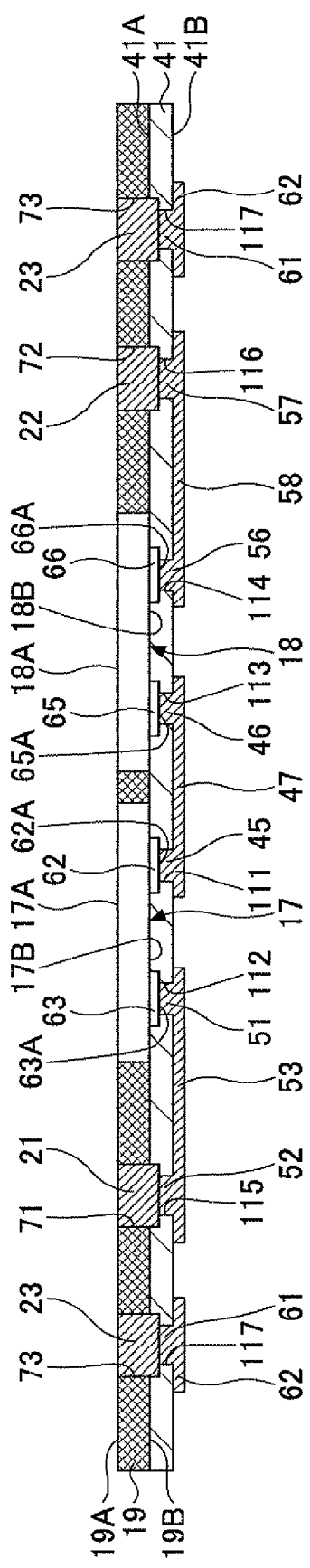
FIG. 10 is a drawing for showing an eighth phase of manufacturing the semiconductor device according to the first embodiment of the present invention.

Next, in a process shown in FIG. 10, the via-plugs 45, 46, 51, 52, 56, 57, 61, and wires 47, 53, 58, 62 are simultaneously formed at the opening portions 111-117 and on the lower face 41B of the insulating layer 41. In this way, the electrode pads 62, 63 provided to the electronic component 17 and the via-plugs 45, 51 are directly connected, and the electrode pads 65, 66 provided to the electronic component 18 and the via-plugs 45, 56 are directly connected.

Therefore, by directly connecting the electrode pads 62, 63 65, 66 provided to the electronic components 17, 18 and the via-plugs 45, 46, 51, 56, the thickness of the semiconductor device 11 may be reduced as compared to the related-art semiconductor device where the electronic components and the wiring pattern are electrically connected through the bump or the metal wire.

The via-plug 52 is directly connected to a lower end of the piercing electrode 21, and the via-plug 57 is directly connected to a lower end of the piercing electrode 22. Also, the via-plug 61 is directly connected to a lower end of the piercing electrode 23.

The via-plugs 45, 46, 51, 52, 56, 57, 61 and the wires 47, 53, 58, 62 are, for example, formed by a semi-additive method. Materials for the via-plugs 45, 46, 51, 52, 56, 57, 61 and the wires 47, 53, 58, 62 may be, for example, copper (Cu) films.

Figure 11:
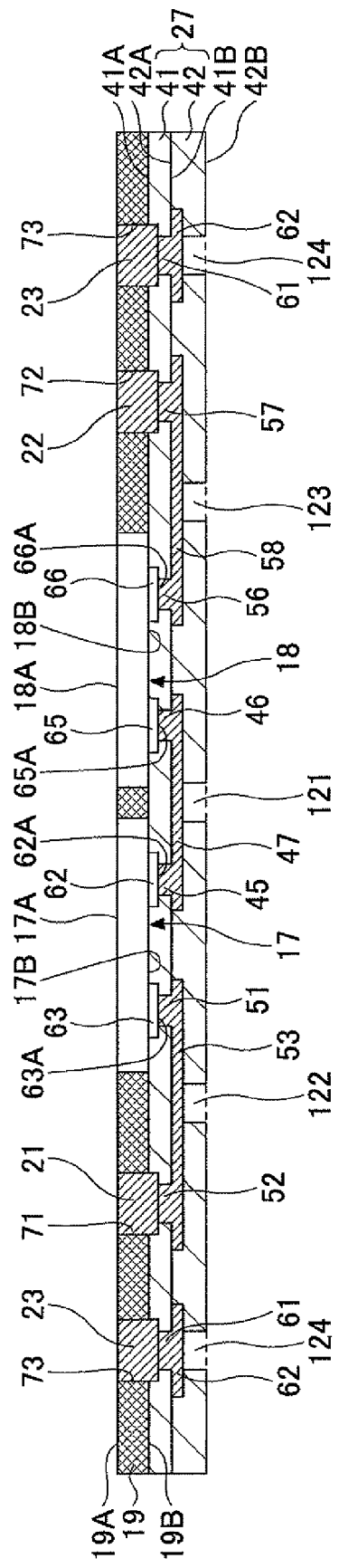
FIG. 11 is a drawing for showing a ninth phase of manufacturing the semiconductor device according to the first embodiment of the present invention.

Subsequently, in a process shown in FIG. 11, by conducting a process same as that shown in FIG. 9, an insulating layer 42 having opening portions 121-124 at a lower face 41B of the insulating layer 41 is formed. In this way, a laminated body 27 where a plurality of the insulating layers 41, 42 is laminated is formed. The opening portion 121 is formed to expose a part of the wire 47, and the opening portion 122 is formed to expose a part of the wire 53. The opening portion 123 is formed o expose a part of the wire 58, and the opening portion 124 is formed to expose a part of the wire 62. As the insulating layer 42, for example, an epoxy-resin film may be employed.

Figure 12:
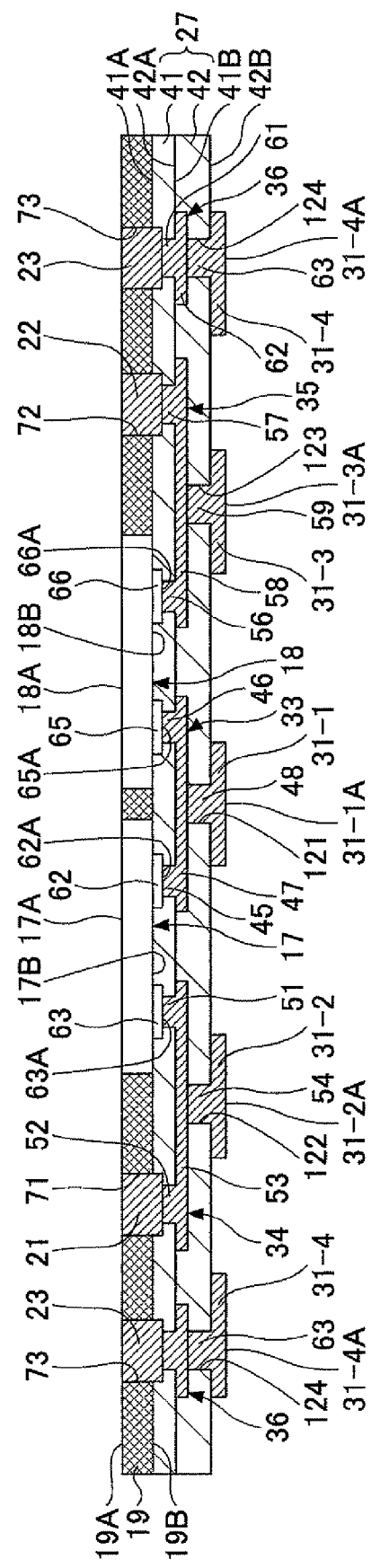
FIG. 12 is a drawing for showing a tenth phase of manufacturing the semiconductor device according to the first embodiment of the present invention.

Next, in a process shown in FIG. 12, by conducting a process which is the same as that shown in FIG. 10, the outside connection pads 31-1, 31-2, 31-3, 31-4 are simultaneously formed, the outside connection pads 31-1, 31-2, 31-3, 31-4 having the via-plugs 48, 54, 59, 63, and the connecting faces 31-1A, 31-2A, 31-3A, 31-4A at the opening portions 121-124 and on the lower face 42B of the insulating layer 42.

In this way, the wiring pattern 33 for electrically connecting the electronic components 17, 18, and the outside connection pad 31-1; the wiring pattern 34 for electrically connecting the electronic component 17 and the piercing electrode 21, and the outside connection pad 31-2; the wiring pattern 35 for electrically connecting the electronic component 18 and the piercing electrode 22, and the outside connection pad 31-3; and the wiring pattern 36 for electrically connecting the electronic components 17, 18, the piercing electrode 23 and the outside connection pad 31-4 are formed.

As materials for the via-plugs 48, 54, 59, 63, and the outside connection pads 31-1, 31-2, 31-3, 31-4, copper (Cu) films, for example, may be employed.

Figure 13:
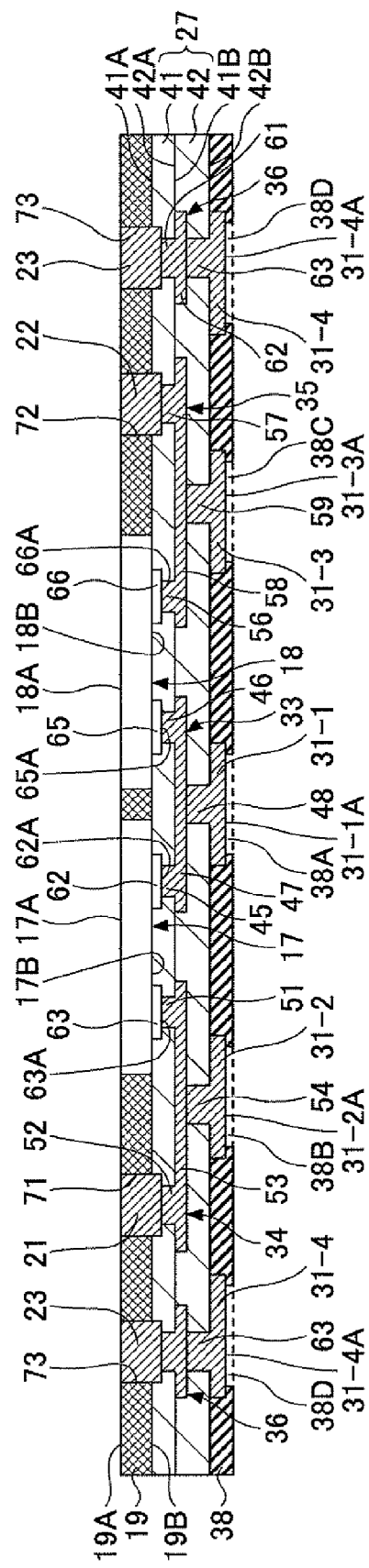
FIG. 13 is a drawing for showing an eleventh phase of manufacturing the semiconductor device according to the first embodiment of the present invention.

Subsequently, in a process shown in FIG. 13, a solder resist layer 38 having opening portions 38A, 38B, 38C, 38D on a lower face 42B of the insulating layer 42 is formed. The opening portion 38A is formed to expose the connecting face 31-1A, and the opening portion 38B is formed to expose the connecting face 31-2A. The opening portion 38O is formed to expose the connecting face 31-3A, and the opening portion 38D is formed to expose the connecting face 31-4A. Incidentally, a protective layer may be provided by laminating Ni-plated layers and Au-plated layers alternately on the connecting faces 31-1A, 31-2A, 31-3A, 31-4A. The process shown in FIGS. 9-13 is a multi-layer wiring structure body forming process.

Figure 14:
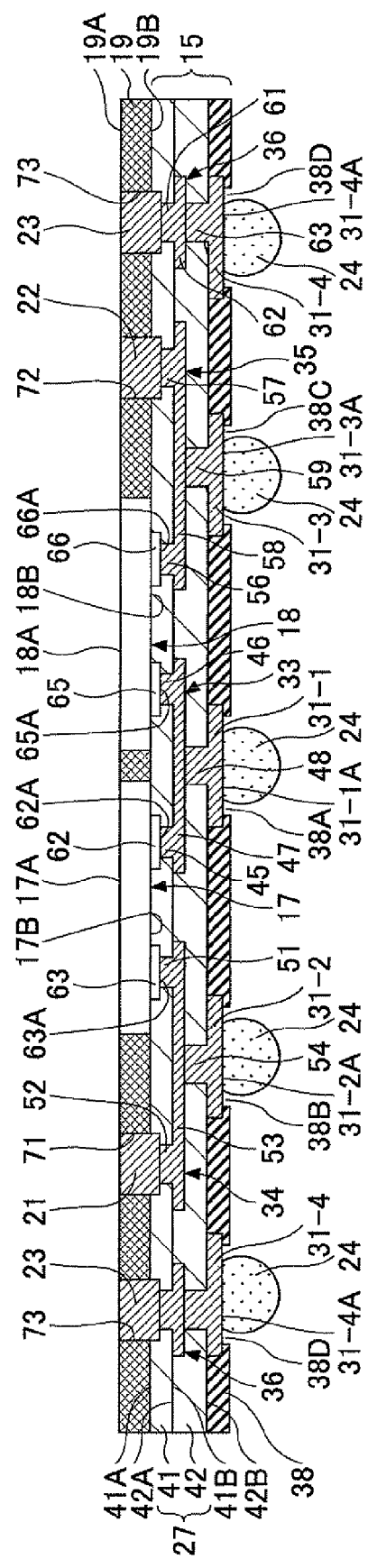
FIG. 14 is a drawing for showing a twelfth phase of manufacturing the semiconductor device according to the first embodiment of the present invention.

Next, in a process shown in FIG. 14, one outside connection terminal 24 is formed on each of the connecting faces 31-1A, 31-2A, 31-3A, 31-4A. As the outside connection terminal 24, a solder ball, for example, may be employed. Incidentally, in FIG. 14, the solder ball is exemplified as the outside connection terminal 24 in FIG. 14. However, a pin terminal may be used as the outside connection terminal 24 instead of the solder ball. Also, as the outside connection terminal 24, the connecting faces 31-1A, 31-2A, 31-3A, 31-4A may be used as the outside connection terminals instead of the solder ball.

According to a method of manufacturing a semiconductor in one embodiment of the invention, the supporting body 101 and the electronic components 17, 18 are adhered by the adhesive 102 so that the upper face 101A of the supporting body 101 and the electrode pads 62, 63, 65, 66 provided to the electronic components 17, 18 contact each other. Next, the insulating member 19 is formed on the upper face 102A of the adhesive 102 to seal a part of periphery (lateral side face) of the electronic components 17, 18. Next, the electronic components 17, 18 and the insulating member 19 are ground. In this way, the electronic components 17, 18 are thinned, and the rear faces 17A, 18A of the thinned electronic components 17, 18, and the upper face 19A of the insulating member 19 are arranged in the same plane. Next, the piercing electrodes 21-23 piercing the insulating member 19 are formed. Next, the adhesive 102 and the supporting body 101 are removed. Afterwards, the wiring patterns 33-36 are formed on the lower face of the insulating member 19, the electrode pads 62, 63, 65, 66, the electrode pad forming faces 17B, 18B of the electronic components 17, 18, and the lower end faces of the piercing electrodes 21-23, the wiring patterns 33-36 being directly connected to the electrode pads 62, 63, 65, 66, and the lower end faces of the piercing electrodes 21-23. Due to this configuration, the thickness of the semiconductor device 11 may be reduced as compared to the related-art semiconductor device where the electronic components and the wiring patterns are electrically connected through bumps or metal wires.

Also, by directly connecting the electrode pads 62, 63, 65, 66 provided to the electronic components 17, 18, and the wiring patterns 33-35, bumps (for example, solder bumps) for connecting the electronic components 17, 18, and the wiring patterns 33-35 are not necessary. Therefore, it is possible to finely and densely form the wiring patterns 33-35 (specifically, the via-plugs 45, 46, 51, 56, and the wires 47, 53, 58). (Second Embodiment)

Figure 15:
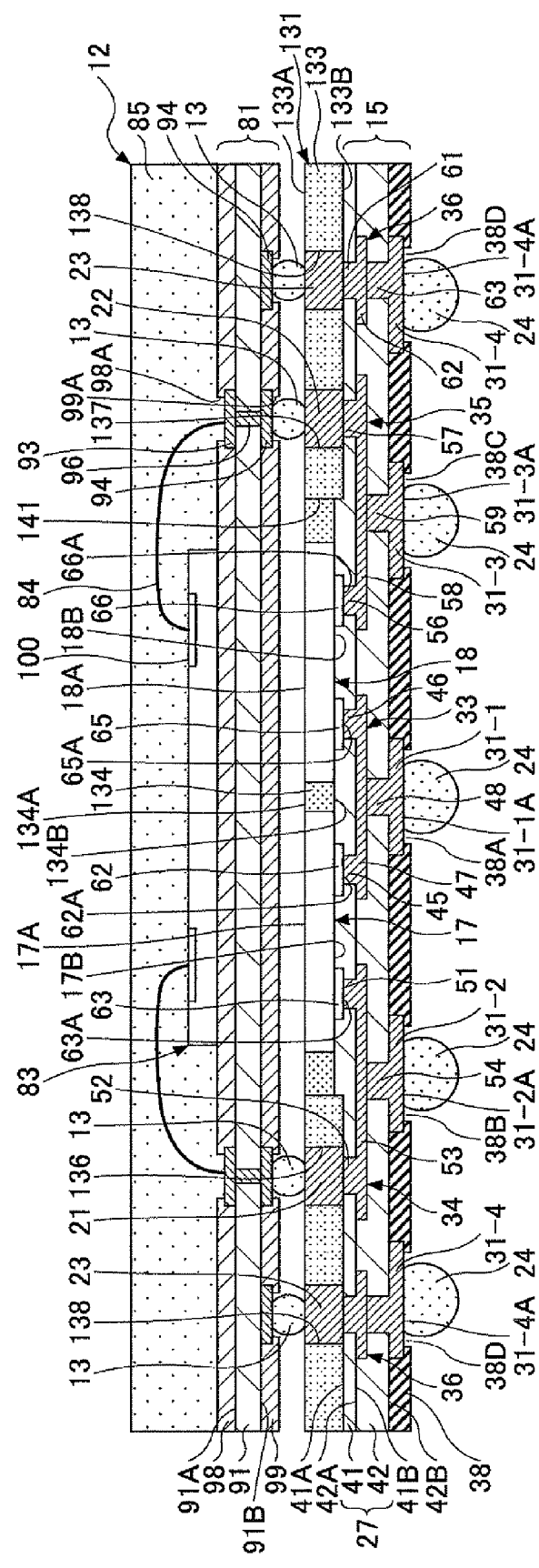
FIG. 15 is a sectional view of an electronic device according to a second embodiment of the present invention.

FIG. 15 is a sectional view of an electronic device according to a second embodiment of the invention. In FIG. 15, parts that are the same as the parts of the electronic device 10 in the first embodiment are given the same reference numerals.

Referring to FIG. 15, the electronic device 130 in the second embodiment is the same as the electronic device 10 except that a semiconductor device 131 is provided in the second embodiment instead of the semiconductor device 11 provided to the electronic device 10 in the first embodiment.

The semiconductor device 131 in the second embodiment is the same as the semiconductor device 11 except that an insulating member 133 and a sealing resin 134 are provided instead of the insulating member 19 provided to the semiconductor device 11 in the first embodiment.

The insulating member 133 is provided on the upper face 41A of the insulating layer 41. The insulating member 133 has through holes 136-138, and a hollow portion 141. The through hole 136 is formed to expose an upper face of the via-plug 52. The through hole 137 is formed to expose an upper face of the via-plug 57. The through hole 138 is formed to expose an upper face of the via-plug 61. The hollow portion 141 is formed to pierce the insulating member 133. The hollow portion 141 is a space for accommodating the electronic components 17, 18 electrically connected to the multilayer wiring structure body 15 (specifically, the wiring patterns 33-35).

The insulating member 133 is formed to have a thickness approximately the same as that of a part of the electronic components 17, 18 positioned on the upper face 41A of the insulating layer 41. In a case where this part has a thickness of 200 μm, the insulating member 133 may have a thickness of, for example, 200 μm. The insulating member 133 has an upper face 133A which is flat. The upper face 133A of the insulating member 133 is arranged in a substantially same plane as the rear faces 17A, 18A of the electronic components 17, 18. Due to this configuration, the upper face 133A of the insulating member 133 and the rear faces 17A, 18A of the electronic components 17, 18 are arranged in the same plane. As the insulating member 133 stated above, an epoxy-resin layer, for example, may be employed.

The sealing resin 134 is arranged to fill up the hollow portion 141 which houses the electronic components 17, 18. The sealing resin 134 exposes the rear faces 17A, 18A of the electronic components 17, 18. The sealing resin 134 covers peripheries of the electronic components 17, 18. In this way, the sealing resin 134 seals the peripheries of the electronic components 17, 18. An upper face 134A of the sealing resin 134 is a flat face. The upper face 134A of the sealing resin 134 is arranged to be on a substantially same plane as the rear faces 17A, 18A of the electronic components 17, 18, and the upper face 133A of the insulating member 133. The thickness of the sealing resin 134 is substantially the same as that of parts of the electronic components 17, 18 positioned on the upper face 41A of the insulating layer 41 and the same as that of the insulating member 133. The sealing resin 134 has a thickness of, for example, 200 μm. As a material for the sealing resin 134, for example, an epoxy-resin may be used.

Due to the configuration of the semiconductor device 131 according to the second embodiment of the invention, effects which are the same as that of the semiconductor device 11 of the first embodiment may be obtained.

According to the electronic device of one embodiment, by arranging the rear faces 17A, 18A of the electronic components 17, 18, the upper face 133A of the insulating member 133, and the upper face 134A of the sealing resin 134 in the same plane, an upper face of the semiconductor device 131, which faces the semiconductor device 12, may be flat. Therefore, the size in the direction of height of the inside connection terminal 13 positioned between the semiconductor device 131 and the semiconductor device 12 may be reduced. Accordingly, the thickness of the electronic device 130 may be reduced.

Furthermore, by reducing the height of the inside connection terminal 13, the piercing electrodes 21-23 may be arranged with a narrow pitch. Therefore, an electrical connection region between the semiconductor device 131 and the semiconductor device 12 may be enlarged (in other words, the number of inside connection terminals 13 located between the semiconductor device 131 and the semiconductor device 12 may be increased).

Also, since it is possible to reduce a diameter of the inside connection terminal 13 such as a solder ball, the piercing electrodes 21-23 may have narrow pitches.

FIGS. 16-23 are views for showing a method of manufacturing a semiconductor device 131 according to the second embodiment of the invention. In FIGS. 16-23, parts that are the same as the parts of the semiconductor device 131 in the second embodiment are given the same reference numerals.

Referring to FIGS. 16-23, a method of manufacturing the semiconductor device 131 according to the second embodiment of the invention is explained as below. First, in a process shown in FIG. 16, the insulating member 133 is formed on the upper face 101A of the supporting body 101.

Figure 16:
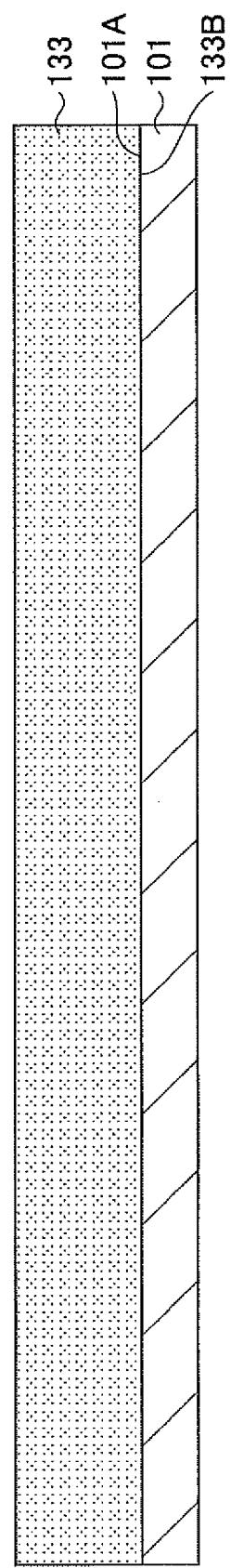
FIG. 16 is a drawing for showing a first phase of manufacturing the semiconductor device according to the second embodiment of the present invention.

To be specific, the insulating member 133 is formed by, for example, applying a resin (for example, an epoxy-resin) to the upper face 101A of the supporting body 101. Incidentally, the insulating member 133 shown in FIG. 16 is formed to have a thickness greater than that of the insulating member 133 shown in FIG. 15. In this phase, the insulating member 133 may have a thickness of, for example, 800 μm.

Figure 17:
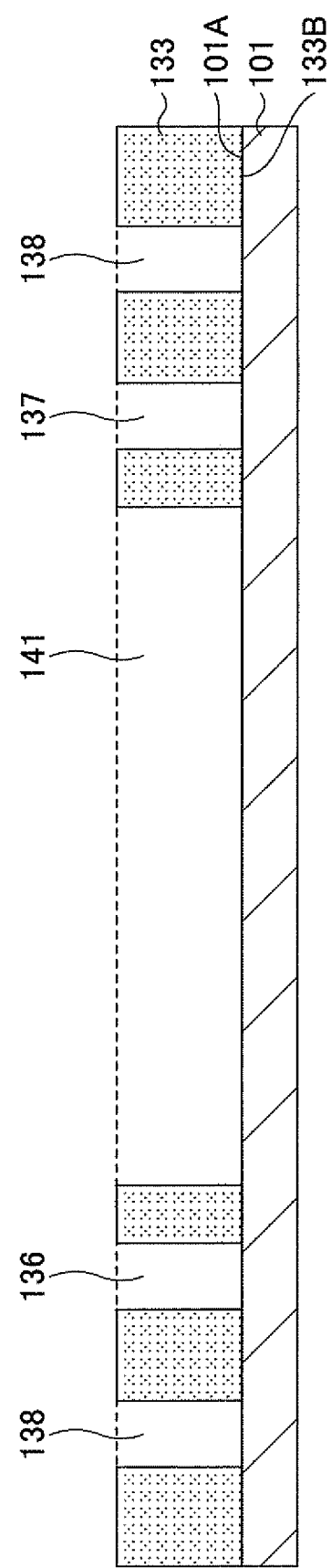
FIG. 17 is a drawing for showing a second phase of manufacturing the semiconductor device according to the second embodiment of the present invention.

Next, in a process shown in FIG. 17, the hollow portion 141 and the through holes 136-138 piercing the insulating member 133 are formed. The hollow portion 141 and the through holes 136-138 are formed by laser irradiation at portions of the insulating member 133 corresponding to regions for the hollow portion 141 and the through holes 136-138. Incidentally, the depths of the hollow portion 141 and the through holes 136-138 shown in FIG. 17 are greater than that of the hollow portion 141 and the through holes 136-138 shown in FIG. 15 (for example, 200 μm). In a case where each of the electronic components 17, 18 has a size of 5 mm×9 mm, the hollow portion 141 may have a size of, for example, 15 mm×14 mm. Also, each of the piercing electrodes 136-138 may have a diameter of, for example, 200 μm.

Figure 18:
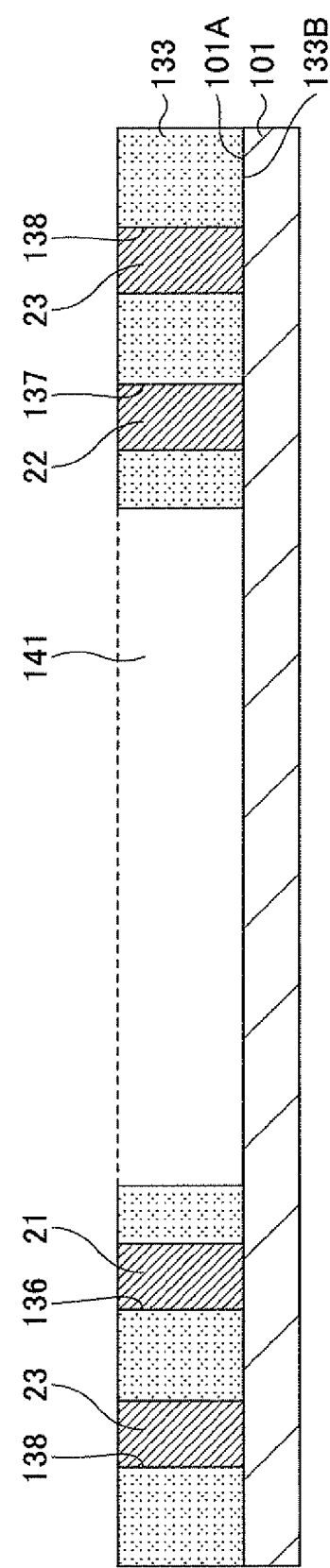
FIG. 18 is a drawing for showing a third phase of manufacturing the semiconductor device according to the second embodiment of the present invention.

In a process shown in FIG. 18, the piercing electrode 21 filling up the through hole 136, the piercing electrode 22 filling up the through hole 137, and the piercing electrode 23 filling up the through hole 138 are formed simultaneously. The plated metal for forming the piercing electrodes 21-23 may not need to completely fill up the through holes 136-138. The piercing electrodes 21-23 are formed by a plating treatment which is the same as the process of the first embodiment shown in FIG. 7. Incidentally, in order not to form a plating film on the hollow portion 141, the hollow portion 141 is covered by a resist film before the plating treatment. As a material for the piercing electrodes 21-23, for example, a copper (Cu) film may be used.

Figure 19:
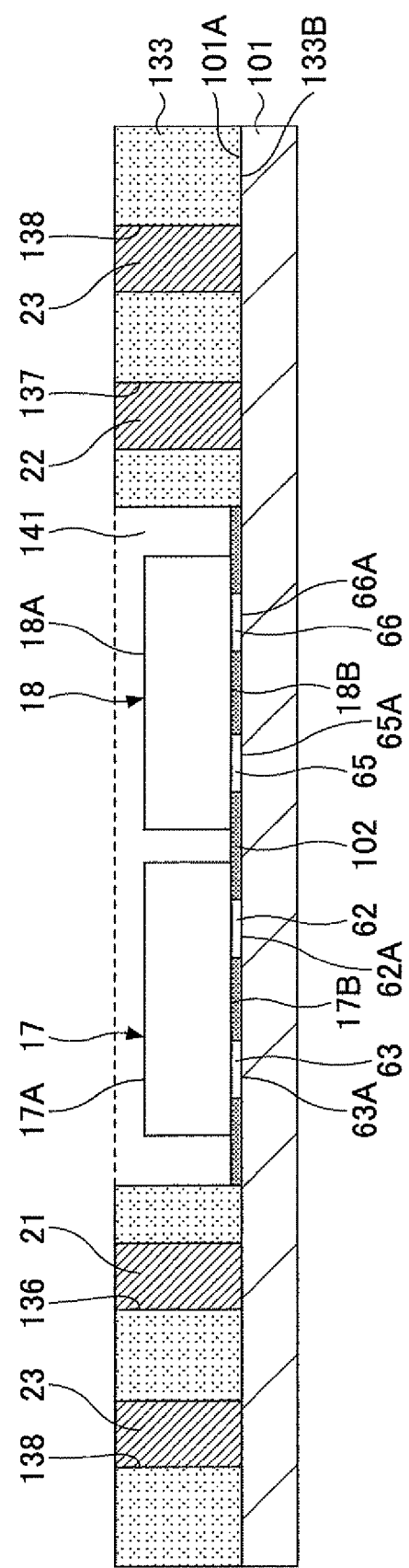
FIG. 19 is a drawing for showing a fourth phase of manufacturing the semiconductor device according to the second embodiment of the present invention.

Subsequently, in a process shown in FIG. 19, the electronic components 17, 18, and the supporting body 101 are adhered by the adhesive 102 so that the upper face 101A of the portions of the supporting body 101 corresponding to a region to form the hollow portion 141, and the connecting faces 62A, 63A, 65A, 66A contact each other. The electronic components 17, 18 shown in FIG. 19 are pre-thinned electronic components 17, 18, and are configured to be thicker than the electronic components 17, 18 shown in FIG. 15. The pre-thinned electronic components 17, 18 are easier to handle than thinned electronic components 17, 18. Therefore, it is possible to accurately adhere the electronic components 17, 18 to predetermined positions of the supporting body 101. The thickness of each of the pre-thinned electronic components 17, 18 may be, for example, 700 µm.

As the electronic components 17, 18, for example, a semiconductor chip may be used. Specifically, a semiconductor chip for a CPU may be employed as the electronic components 17, 18. A semiconductor chip for the CPU may be employed as one of the electronic components 17, 18, and a semiconductor chip for a memory may be employed as the other. Also, the semiconductor chip for the CPU may be employed for one of the electronic components 17, 18, and a semiconductor chip for a GPU (Graphics Processing Unit) may be employed for the other.

Figure 20:
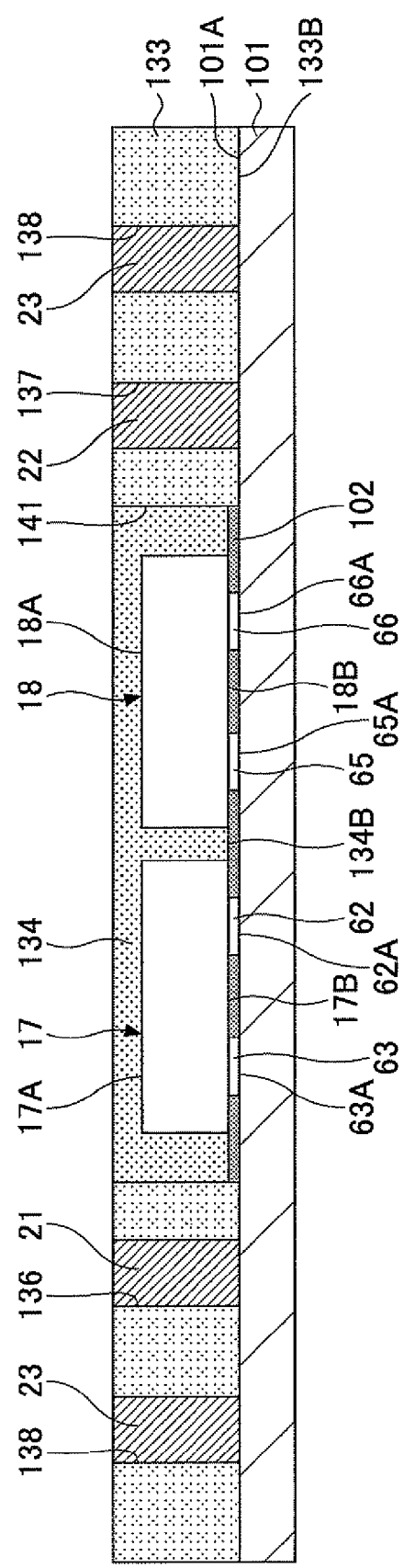
FIG. 20 is a drawing for showing a fifth phase of manufacturing the semiconductor device according to the second embodiment of the present invention.

Next, in a process shown in FIG. 20, the sealing resin 134 for filling up the hollow portion 141 is formed. In this way, the electronic components 17, 18 are sealed by the sealing resin 134. Alternatively, the hollow portion 141 may not need to be completely filled up by the sealing resin 134, so that the rear faces 17A, 18A of the electronic components 17, 18 are exposed. The sealing resin may be formed by, for example, a transfer molding method, a compression forming method, a potting method or the like. As a material for the sealing resin 134, for example, an epoxy-resin may be used.

Figure 21:
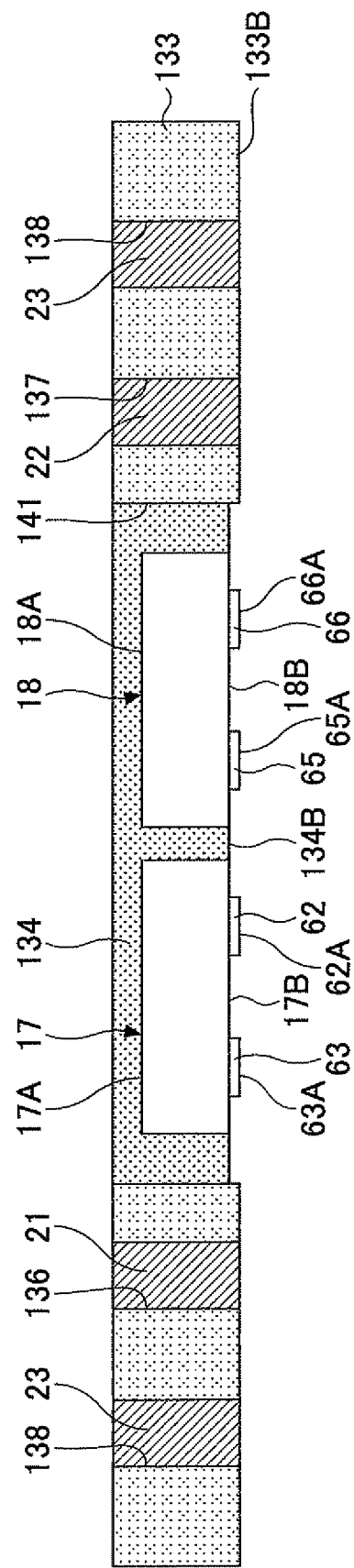
FIG. 21 is a drawing for showing a sixth phase of manufacturing the semiconductor device according to the second embodiment of the present invention.

Subsequently, in a process shown in FIG. 21, the supporting body 101 and the adhesive 102 are removed from a structure body shown in FIG. 20. Specifically, for example, by mechanically removing the supporting body 101, the adhesive 102 is removed as well as the supporting body 101. In this way, the electrode pad forming faces 17B, 18B of the electronic components 17, 18, the electrode pads 62, 63, 65, 66, the lower end faces of the piercing electrodes 21-23, the lower face 133B of the insulating member 133, and the lower face 134B of the sealing resin 134 are exposed.

Incidentally, if the supporting body 101 and the adhesive 102 are removed, the lower face 134B of the sealing resin 134 and the electrode pad forming faces 17B, 18B of the electronic components 17, 18 are depressed by the thickness of the adhesive 102 from the lower face 133B of the insulating member 133. Nevertheless, such depressions do not cause any problems in manufacturing.

Figure 22:
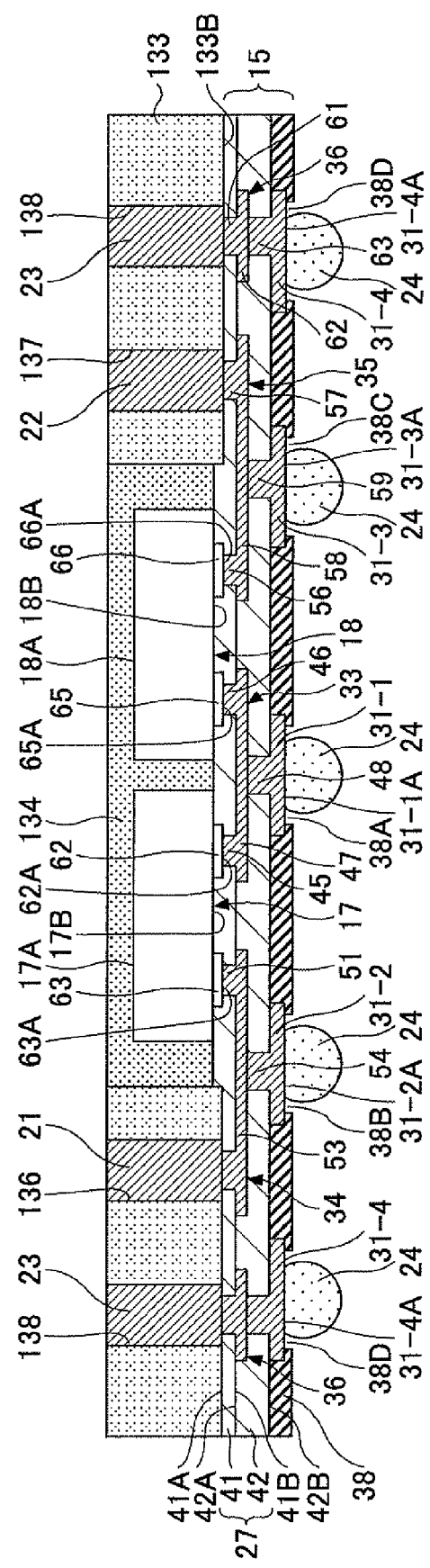
FIG. 22 is a drawing for showing a seventh phase of manufacturing the semiconductor device according to the second embodiment of the present invention.

Next, in a process shown in FIG. 22, by conducting a process which is the same as that of the first embodiment shown in FIGS. 9-14, the multi-layer wiring structure body 15, which is electrically connected to the electronic components 17, 18 and the piercing electrodes 21-23, is formed on the electrode pad forming faces 17B, 18B of the electronic components 17, 18, the electrode pads 62, 63, 65, 66, the lower end faces of the piercing electrodes 21-23, the lower face 133B of the insulating member 133, and the lower face 134B of the sealing resin 134.

At this time, the wiring pattern 33 is formed to be directly connected to the electrode pads 62, 65. The wiring pattern 34 is formed to be directly connected to a lower end of the piercing electrode 21 and the electrode pad 63. The wiring pattern 35 is formed to be directly connected to a lower end of the piercing electrode 22 and the electrode pad 66. The wiring pattern 36 is formed to be directly connected to a lower end of the piercing electrode 23.

In this way, by directly connecting the electrode pads 62, 63, 65, 66, and the wiring patterns 33-35, the thickness of the semiconductor device 131 may be reduced as compared to the related-art semiconductor device where the electronic components and the wiring patterns are electrically connected through bumps or metal wires.

Subsequently, in a process shown in FIG. 23, by grinding (for example, by means of a backside grinder) the electronic components 17, 18, the insulating member 133, and the sealing resin 134 from an upper face side of a structure body shown in FIG. 22, the electronic components 17, 18 are thinned. In this way, the semiconductor device 131 according to the second embodiment is manufactured.

In a case where the through holes 136-138 are not completely filled up by the plated metal for forming the piercing electrodes 21-23, the piercing electrodes 21-23 are formed by filling the plated metal in the through holes 136-138 after the grinding process so that the upper end faces of the piercing electrodes 21-23 and the upper face of the insulating member 133 are arranged on the same plane. For example, the piercing electrodes 21-23 are formed by filling the plated metal to about 250 µm from bottom faces of the through holes 136-138. In this way, the forming time of the piercing electrodes 21-23 is reduced.

Also, in a case where the hollow portion 141 is not completely filled by the sealing resin 134, the insulating resin 134 is formed by being filled in the hollow portion 141 after the grinding process so that the upper face of the insulating resin 134 and the upper face of the insulating member 133 are arranged on the same plane. For example, the sealing resin 134 is formed by filling in the hollow portion 141 to about 250 µm from a bottom face of the hollow portion 141, so that the rear faces 17A, 18A of the electrode components 17, 18 are exposed from the sealing resin 134. Accordingly, an amount of the sealing resin 134 to be ground, and the processing time are reduced.

Figure 23:
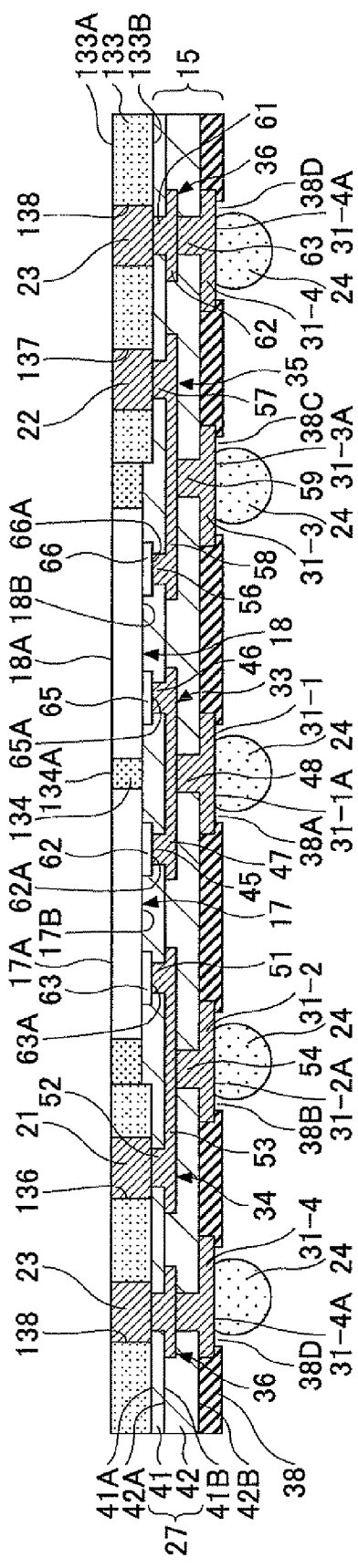
FIG. 23 is a drawing for showing an eighth phase of manufacturing the semiconductor device according to the second embodiment of the present invention.

Due to the grinding process explained above, the depths of the piercing electrodes 21-23 are smaller in FIG. 23 than that of the piercing electrodes 21-23 in FIG. 22. Also, the upper end faces of the piercing electrodes 21-23, the rear faces 17A, 18A of the electronic components 17, 18, the upper face 133A of the insulating member 133, and the upper face 134A of the sealing resin 134 are arranged in the same plane.

Thicknesses of portions of the thinned electronic components 17, 18 positioned on the upper face 41A of the insulating layer 41 may be, for example, 200 µm. In this case, the depths of the piercing electrodes 21-23 may be, for example, 200 µm. Also, the thicknesses of the insulating member 133 and the sealing resin 134 may be, for example, 200 µm.

Incidentally, a protective layer (for example, Ni/Au laminated layers which are formed by laminating Ni coat layers and Au coat layers alternately on the end faces of the piercing electrodes 21-23) may be provided on end faces of the piercing electrodes 21-23 on a side where the inside connection terminal 13 is connected after thinning the electronic components 17, 18.

Also, as a modified example of the processes shown in FIGS. 16-23, the thickness of the insulating member 133 may be 300 μm in the process shown in FIG. 16; the electronic components 17, 18 (each of the electronic components 17, 18 has a thickness of 700 μm) are formed so that the rear faces 17A, 18A protrude from the hollow portion 141 in the process shown in FIG. 19; and the sealing resin 134 may be provided so that only lateral side faces of the hollow portion 141 and the electronic components 17, 18 are sealed in the process shown in FIG. 20. In other words, in FIG. 20, the sealing resin may be provided so that the rear faces 17A, 18A of the electronic components 17, 18 are exposed. Accordingly, amounts of the insulating member 133 and the sealing resin 134 to be ground, and the processing time for the process shown in FIG. 23 are reduced.

According to one embodiment of a method of manufacturing a semiconductor device, the insulating member 133 is formed having through holes 136-138 and the hollow portion 141 on the upper face 101A of the supporting body 101. Next, the electronic components 17, 18 are adhered by the adhesive 102 to portions of the upper face 101A of the supporting body 101, which are exposed from the hollow portion 141, so that the connecting faces 62A, 63A, 65A, 66A, and the upper face 101A of the supporting body 101 contact each other. Next, the sealing resin 134 is formed to seal the electronic components 17, 18 inside the hollow portion 141. Next, the adhesive 102 and the supporting body 101 are removed. Next, the multi-layer wiring structure body 15 is formed to directly connect the electrode pads 62, 63, 65, 66 of the electronic components 17, 18, and the wiring patterns 33-35. In this way, the thickness of the semiconductor device 131 may be reduced as compared to the related-art semiconductor where electronic components and wiring patterns are electrically connected through bumps or metal wires.

Furthermore, by directly connecting the electrode pads 62, 63, 65, 66 provided to the electronic components 17, 18, and the wiring patterns 33-35, the bumps (for example, solder bumps) for connecting the electronic components 17, 18, and the wiring patterns 33-35 is not necessary. Therefore, it is possible to finely and densely form the wiring patterns 33-35 (specifically, the via-plugs 45, 46, 51, 56, and the wires 47, 53, 58).

Incidentally, in this embodiment of the invention, after forming the multi-layer wiring structure body 15, the electronic components 17, 18 are thinned. However, alternatively, the electronic components 17, 18 may be ground to be thinned after the process shown in FIG. 20. Subsequently, the supporting body 101 may be removed. Then, the multi-layer wiring structure body 15 may be formed.

Also, the outside connection terminal 39 may be formed after the electronic components 17, 18 are thinned.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although embodiments of the present invention have been described in detail, it should be understood that various changes, substitutions, and alterations may be made hereto without departing from the spirit and scope of the invention.

For example, in the semiconductor devices 11, 131 of the first and second embodiments, two electronic components (the electronic components 17, 18) are provided. However, the number of the electronic components arranged in the multi-layer wiring structure body 15 is not limited thereto. In other words, the number of the electronic components arranged on the multi-layer wiring structure body 15 may be one or more than three.

What is claimed is:

1. A semiconductor device, comprising:
an electronic component having an electrode pad provided on an electrode pad forming face, and a rear face positioned on a side opposite to the electrode pad forming face;
an insulating member provided to seal a periphery of the electronic component, and having a first face exposing the electrode pad forming face of the electronic component and a second face exposing the rear face of the electronic component;
a multi-layer wiring structure body provided to cover the first face of the insulating member, the electrode pad, and the electrode pad forming face, and including a plurality of insulating layers laminated on each other, and a wiring pattern; and
a piercing electrode piercing the insulating member from the first face to the second face,
wherein the wiring pattern is directly connected to the electrode pad and the piercing electrode,
said multi-layer wiring structure body further includes an external connection pad located on a side opposite to the electronic component,
the wiring pattern is connected to the external connection pad, and includes a first connecting face being exposed from a part of the multi-layer wiring structure body contacting the electrode pad, and a second connecting face being exposed from a part of the multi-layer wiring structure body contacting the insulating member, and
the piercing electrode is connected to the second connecting face,
wherein the insulating layers cover the first face of the insulating member, the electrode pad, and the electrode forming face of the electronic component, said insulating layers having a first opening to expose an end face of the piercing electrode and a second opening to expose the electrode pad, and
wherein the multi-layer wiring structure further comprises a wiring layer including the wiring pattern and located on the insulating layers, said wiring layer being connected to the piercing electrode and the electrode pad through vias provided in the first and second openings.

2. The semiconductor device as claimed in claim 1, wherein the piercing electrode has an end face located on a side of the second face of the insulating member, said end face, the second face of the insulating member, and the rear face of the electronic component forming substantially one plane.

3. The semiconductor device as claimed in claim 1, wherein the multi-layer wiring structure body further comprises:
a plurality of wiring layers, said plurality of insulating layers and wiring layers being laminated alternately; and
a solder resist layer provided on an uppermost wiring layer of the plurality of wiring layers, wherein the external connection pad is located on the uppermost wiring layer, and the solder resist layer has an opening to expose the external connection pad.

4. A semiconductor device, comprising:
an electronic component having an electrode pad provided on an electrode pad forming face, and a rear face positioned on a side opposite to the electrode pad forming face;
an insulating member having a hollow portion housing the electronic component, a first face exposing the electrode pad forming face of the electronic component, and a second face exposing the rear face of the electronic component, said hollow portion penetrating the insulating member from the first face to the second face;
a sealing resin provided in the hollow portion to seal a periphery of the electronic component, and having a first face of the sealing resin exposing the electrode pad forming face of the electronic component, and a second face of the sealing resin exposing the rear face of the electronic component;
a multi-layer wiring structure body provided to cover the first face of the insulating member, the first face of the sealing resin, the electrode pad, and the electrode pad forming face, and including a plurality of insulating layers laminated on each other, and a wiring pattern; and
a piercing electrode piercing the insulating member from the first face to the second face,
wherein the wiring pattern is directly connected to the electrode pad and the piercing electrode,
wherein the insulating layers cover the first face of the insulating member, the first face of the sealing resin, the electrode pad, and the electrode pad forming face of the electronic component, said insulating layers having a first opening to expose an end face of the piercing electrode and a second opening to expose the electrode pad, and
wherein the multi-layer wiring structure further comprises a wiring layer including the wiring pattern and located on the insulating layers said wiring layer being connected to the end face of the piercing electrode and the electrode pad through vias provided in the first and second openings.

5. The semiconductor device as claimed in claim 4,
wherein said multi-layer wiring structure body further includes an external connection pad located on a side opposite to the electronic component,
the wiring pattern is connected to the external connection pad, and has a first connecting face being exposed from a part of the multi-layer wiring structure body contacting the electrode pad, and a second connecting face being exposed from a part of the multi-layer wiring structure body contacting the insulating member, and
the piercing electrode is connected to the second connecting face.

6. The semiconductor device as claimed in claim 4,
wherein the piercing electrode has an end face located on a side of the second face of the insulating member, said end face of the piercing electrode, the second face of the insulating member, the second face of the sealing resin, and the rear face of the electronic component forming substantially one plane.

7. The semiconductor device as claimed in claim 4, wherein the multi-layer wiring structure body further comprises:
a plurality of wiring layers, said plurality of insulating layers and wiring layers being laminated alternately;
an external connection pad provided at an uppermost wiring layer of the plurality of wiring layers, and
a solder resist layer provided on an uppermost wiring layer of the plurality of wiring layers and exposing the external connection pad.

8. A semiconductor device, comprising:
an electronic component having an electrode pad provided on an electrode pad forming face, and a rear face positioned on a side opposite to the electrode pad forming face;
an insulating member provided to seal a periphery of the electronic component, and having a first face exposing the electrode pad forming face of the electronic component and a second face exposing the rear face of the electronic component;
a multi-layer wiring structure body provided to cover the first face of the insulating member, the electrode pad, and the electrode pad forming face, and including a plurality of insulating layers laminated on each other, and a wiring pattern; and
a piercing electrode piercing the insulating member from the first face to the second face,
wherein the wiring pattern is directly connected to the electrode pad and the piercing electrode,
the multi-layer wiring structure body further includes an external connection pad on an uppermost portion thereof;
the second face of the insulating member partially forms a surface of the semiconductor device;
the piercing electrode has a first end face exposed from the second face of the insulating member for connecting to an external of the semiconductor device; and
the wiring pattern is configured to connect the external connection pad and a second end face of the piercing electrode,
wherein the insulating layers cover the first face of the insulating member, the electrode pad, and the electrode pad forming face of the electronic component, said insulating layers having a first opening to expose the second end face of the piercing electrode and a second opening to expose the electrode pad, and
wherein the multi-layer wiring structure further comprises a wiring layer including the wiring pattern and located on the insulating layers, said wiring layer being connected to the second end face of the piercing electrode and the electrode pad through vias provided in the first and second openings.

9. The semiconductor device as claimed in claim 8,
wherein said external connection pad is located on a side opposite to the electronic component,
the wiring pattern is connected to the external connection pad, and includes a first connecting face being exposed from a part of the multi-layer wiring structure body contacting the electrode pad, and a second connecting face being exposed from a part of the multi-layer wiring structure body contacting the insulating member, and
the second end face of the piercing electrode is connected to the second connecting face.

10. The semiconductor device as claimed in claim 8,
wherein the first end face of the piercing electrode, the second face of the insulating member, and the rear face of the electronic component form substantially one plane.

11. The semiconductor device as claimed in claim 8, wherein the multi-layer wiring structure body further comprises:

a plurality of wiring layers, said plurality of insulating layers and wiring layers being laminated alternately; and a solder resist layer provided on an uppermost wiring layer of the plurality of wiring layers, wherein the external connection pad is located on the uppermost wiring layer, and the solder resist layer has an opening to expose the external connection pad.

\* \* \* \* \*